(12) United States Patent
Kim et al.

(10) Patent No.: US 12,446,308 B2
(45) Date of Patent: Oct. 14, 2025

(54) DISPLAY APPARATUS INCLUDING DUMMY PIXELS IN A NON-DISPLAY AREA

(71) Applicant: Samsung Display Co., Ltd., Yongin-si (KR)

(72) Inventors: Mihae Kim, Yongin-si (KR); Kyeonghwa Kim, Yongin-si (KR); Junyong An, Yongin-si (KR); Kyonghwan Oh, Yongin-si (KR); Chaehan Hyun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 245 days.

(21) Appl. No.: 17/445,694

(22) Filed: Aug. 23, 2021

(65) Prior Publication Data
US 2022/0069033 A1    Mar. 3, 2022

(30) Foreign Application Priority Data
Aug. 28, 2020    (KR) .......................... 10-2020-0109467

(51) Int. Cl.
| | | |
|---|---|---|
| *H10D 86/40* | (2025.01) | |
| *H10D 86/60* | (2025.01) | |
| *H10K 50/842* | (2023.01) | |
| *H10K 59/121* | (2023.01) | |
| *H10K 59/131* | (2023.01) | |
| *H10K 59/65* | (2023.01) | |

(Continued)

(52) U.S. Cl.
CPC ....... *H10D 86/411* (2025.01); *H10K 59/1213* (2023.02); *H10K 59/131* (2023.02); *H10K 59/88* (2023.02); *H10D 86/421* (2025.01); *H10D 86/60* (2025.01); *H10K 50/8426* (2023.02); *H10K 59/65* (2023.02); *H10K 59/8722* (2023.02); *H10K 59/8731* (2023.02)

(58) Field of Classification Search
CPC .............................. H10K 59/00; H10K 59/88
See application file for complete search history.

(56) References Cited

U.S. PATENT DOCUMENTS

| 8,749,459 B2 | 6/2014 | Shin et al. |
|---|---|---|
| 11,251,235 B2 | 2/2022 | Yoon et al. |

(Continued)

FOREIGN PATENT DOCUMENTS

| KR | 10-0570995 B1 | 4/2006 |
|---|---|---|
| KR | 10-0740133 B1 | 7/2007 |

(Continued)

*Primary Examiner* — Lauren Nguyen
(74) *Attorney, Agent, or Firm* — Womble Bond Dickinson (US) LLP

(57) ABSTRACT

A display apparatus includes: a substrate including: a first region; a second region; a first non-display area surrounding the first region and the second region; and a display area surrounding at least a portion of an outline of the first non-display area; a plurality of dummy pixels at the first non-display area, and to not emit light; a plurality of emission control lines connected to at least one of the plurality of dummy pixels; and a plurality of power supply lines to supply a driving voltage to the plurality of dummy pixels, respectively. One of the plurality of power supply lines is electrically connected to one of the plurality of emission control lines, and one of the plurality of power supply lines is connected to one of the plurality of dummy pixels.

13 Claims, 32 Drawing Sheets

(51) Int. Cl.
   *H10K 59/80*  (2023.01)
   *H10K 59/88*  (2023.01)

(56) References Cited

U.S. PATENT DOCUMENTS

| | | |
|---|---|---|
| 11,282,900 B2 | 3/2022 | An et al. |
| 11,404,512 B2 | 8/2022 | Kim et al. |
| 2017/0365217 A1* | 12/2017 | An ................... H10K 59/1315 |
| 2019/0115415 A1* | 4/2019 | Choi ................. G09G 3/3233 |

FOREIGN PATENT DOCUMENTS

| | | |
|---|---|---|
| KR | 10-0940574 B1 | 2/2010 |
| KR | 10-2016-0017670 A | 2/2016 |
| KR | 10-2019-0041553 A | 4/2019 |
| KR | 10-2020-0066502 A | 6/2020 |
| KR | 10-2020-0066505 A | 6/2020 |
| KR | 10-2020-0097371 A | 8/2020 |

* cited by examiner

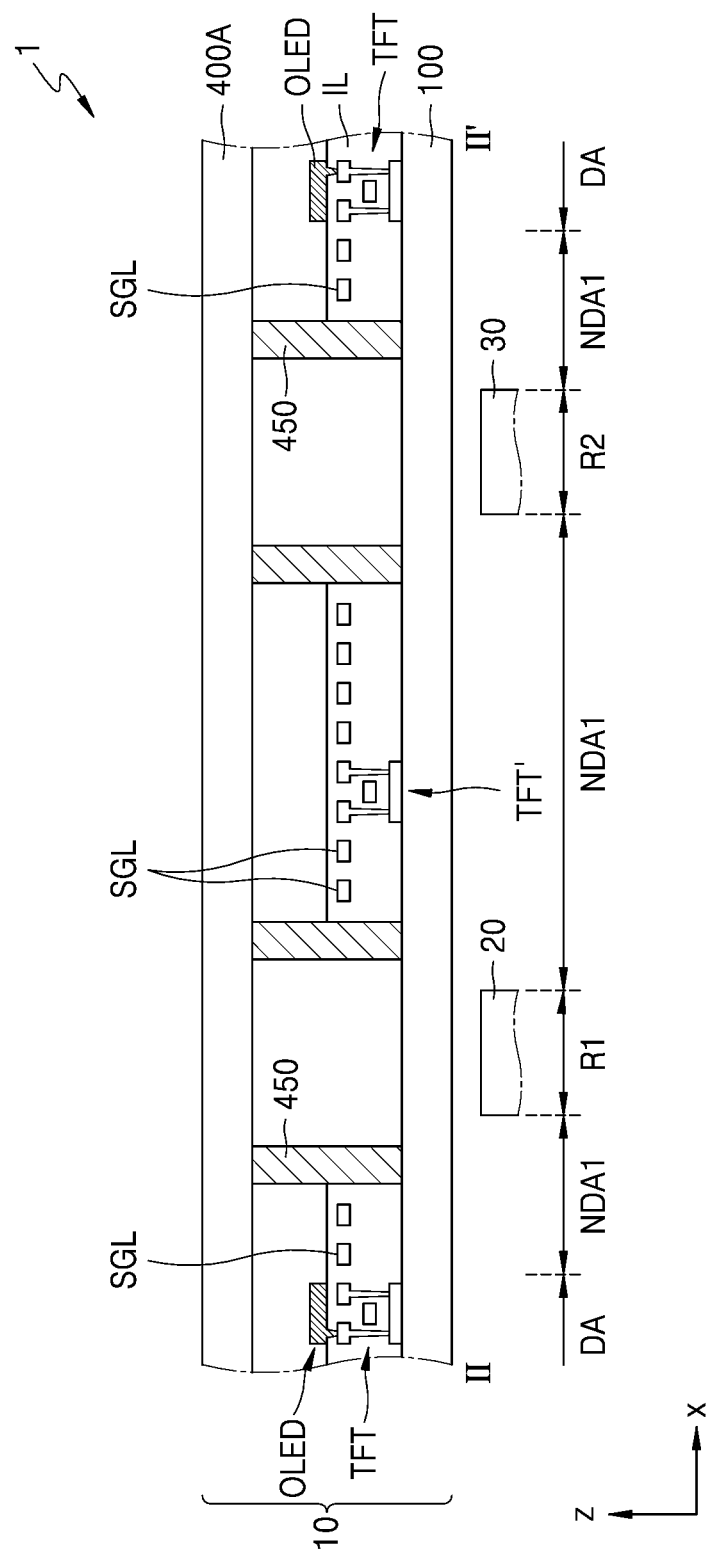

DISPLAY APPARATUS INCLUDING DUMMY PIXELS IN A NON-DISPLAY AREA

CROSS-REFERENCE TO RELATED APPLICATION

This application claims priority to and the benefit of Korean Patent Application No. 10-2020-0109467, filed on Aug. 28, 2020, in the Korean Intellectual Property Office, the entire disclosure of which is incorporated by reference herein.

BACKGROUND

1. Field

Aspects of one or more embodiments relate to an apparatus, and more particularly, to a display apparatus.

2. Description of Related Art

Mobile electronic apparatuses are widely used. Recently, mobile electronic apparatuses have been widely used as not only miniaturized electronic apparatuses, for example, such as mobile phones, but also as tablet personal computers (PCs).

To support various functions, a mobile electronic apparatus includes a display unit to provide a user with visual information such as an image. Recently, because parts for driving a display unit have been miniaturized, the proportion of the display unit of an electronic apparatus has gradually increased, and a structure that may be bent by an angle (e.g., a predetermined angle) with respect to a flat state is under development.

The above information disclosed in this Background section is for enhancement of understanding of the background of the present disclosure, and therefore, it may contain information that does not constitute prior art.

SUMMARY

One or more embodiments of the present disclosure are directed to a display panel including one or more regions in which a camera, a sensor, and/or the like may be arranged inside a display area to increase the number of functions that may be combined or associated with a display unit (e.g., a display or a display device), and an apparatus including the display panel.

However, the aspects and features of the present disclosure are not limited thereto, and additional aspects and features may be set forth, in part, in the description that follows, and in part, may be apparent from the description, or may be learned by practicing one or more of the presented embodiments of the present disclosure.

According to one or more embodiments, a display apparatus includes: a substrate including: a first region; a second region; a first non-display area surrounding the first region and the second region; and a display area surrounding at least a portion of an outline of the first non-display area; a plurality of dummy pixels at the first non-display area, and configured to not emit light; a plurality of emission control lines connected to at least one of the plurality of dummy pixels; and a plurality of power supply lines configured to supply a driving voltage to the plurality of dummy pixels, respectively. One of the plurality of power supply lines is electrically connected to one of the plurality of emission control lines, and one of the plurality of power supply lines is connected to one of the plurality of dummy pixels.

In an embodiment, at least one of the plurality of dummy pixels may be between the first region and the second region.

In an embodiment, the plurality of emission control lines and the plurality of power supply lines may be at different layers from each other, and may be connected to each other through contact holes.

In an embodiment, the plurality of emission control lines may include a protrusion overlapping with the plurality of power supply lines in a plan view, the protrusion being connected to the plurality of power supply lines.

In an embodiment, the plurality of power supply lines may be connected to the protrusion through a contact hole.

In an embodiment, the plurality of dummy pixels may include a switching thin-film transistor, and at least a portion of the switching thin-film transistor may be disconnected.

In an embodiment, the display apparatus may further include a plurality of data lines configured to transfer a data signal to the plurality of dummy pixels. Each of the plurality of dummy pixels may include a switching thin-film transistor, and the data lines may be electrically insulated from the switching thin-film transistor.

In an embodiment, the display apparatus may further include a plurality of pixels including: a pixel circuit including at least one transistor; and a display element connected to the pixel circuit. Each of the plurality of dummy pixels may include an auxiliary pixel circuit including at least one dummy transistor.

In an embodiment, the display apparatus may further include a pixel-defining layer on the pixel circuit, the pixel-defining layer having an opening corresponding to each of the plurality of pixels. The pixel-defining layer may include a flat top surface corresponding to the plurality of dummy pixels.

In an embodiment, the display apparatus may further include an electronic element corresponding to at least one of the first region or the second region.

In an embodiment, a size of the first region may be different from a size of the second region.

In an embodiment, the display apparatus may further include first and second driver circuits at a second non-display area surrounding at least a portion of the display area, and the first and second driver circuits may face each other.

In an embodiment, the substrate may include long sides and short sides, and the first driver circuit and the second driver circuit may be located in a direction along the long sides of the substrate.

According to one or more embodiments, a display apparatus includes: a substrate including: a first region; a second region; a first non-display area surrounding the first region and the second region; and a display area surrounding at least a portion of an outline of the first non-display area; a plurality of dummy pixels at the first non-display area, and configured to not emit light, each of the plurality of dummy pixels including an operation control thin-film transistor; first and second driver circuits at a second-non display area surrounding at least a portion of an outline of the display area, the first and second driver circuits facing each other; and a driver power line at the second non-display area, and configured to apply power to at least one of the first driver circuit or the second driver circuit. The operation control thin-film transistor of each of the plurality of dummy pixels is connected to the driver power line.

In an embodiment, at least one of the plurality of dummy pixels may be between the first region and the second region.

In an embodiment, the driver power line and an emission control line may be located at different layers from each other.

In an embodiment, the emission control line may be electrically connected to the driver power line.

In an embodiment, each of the plurality of dummy pixels may further include a switching thin-film transistor, and at least a portion of the switching thin-film transistor may be disconnected.

In an embodiment, the display apparatus may further include a plurality of data lines configured to transfer a data signal to the plurality of dummy pixels, respectively, each of the plurality of dummy pixels may further include a switching thin-film transistor, and the plurality of data lines may be electrically insulated from the switching thin-film transistor.

In an embodiment, the display apparatus may further include a plurality of pixels, each of the plurality of pixels including: a pixel circuit including at least one transistor; and a display element connected to the pixel circuit. Each of the plurality of dummy pixels may include an auxiliary pixel circuit including at least one dummy transistor.

In an embodiment, the display apparatus may further include a pixel-defining layer on the pixel circuit, and having an opening corresponding to a pixel from among the plurality of pixels. The pixel-defining layer may correspond to the plurality of dummy pixels, and may include a flat top surface.

In an embodiment, the display apparatus may further include an electronic element corresponding to at least one of the first region or the second region.

In an embodiment, the substrate may include long sides and short sides, and the first driver circuit and the second driver circuit may be located in a direction along the long sides of the substrate.

According to one or more embodiments, a display apparatus includes: a substrate including: a first region; a second region; a first non-display area surrounding the first region and the second region; and a display area surrounding at least a portion of an outline of the first non-display area; a plurality of dummy pixels at the first non-display area, and configured to not emit light, each of the plurality of dummy pixels including a switching thin-film transistor; first and second driver circuits at a second-non display area surrounding at least a portion of an outline of the display area, the first and second driver circuits facing each other; and a plurality of data lines configured to transfer a data signal to the plurality of dummy pixels, respectively. The switching thin-film transistor of each of the plurality of dummy pixels is insulated from the plurality of data lines.

These and/or other aspects and features of the present disclosure will become apparent and more readily appreciated from the following detailed description of the example embodiments, the accompanying drawings, and the claims.

BRIEF DESCRIPTION OF THE DRAWINGS

The above and other aspects and features of the present disclosure will be more clearly understood from the following detailed description of the illustrative, non-limiting example embodiments with reference to the accompanying drawings, in which:

FIGS. 2A-2C are cross-sectional views of a display apparatus according to one or more embodiments;

DETAILED DESCRIPTION

Figure 1:
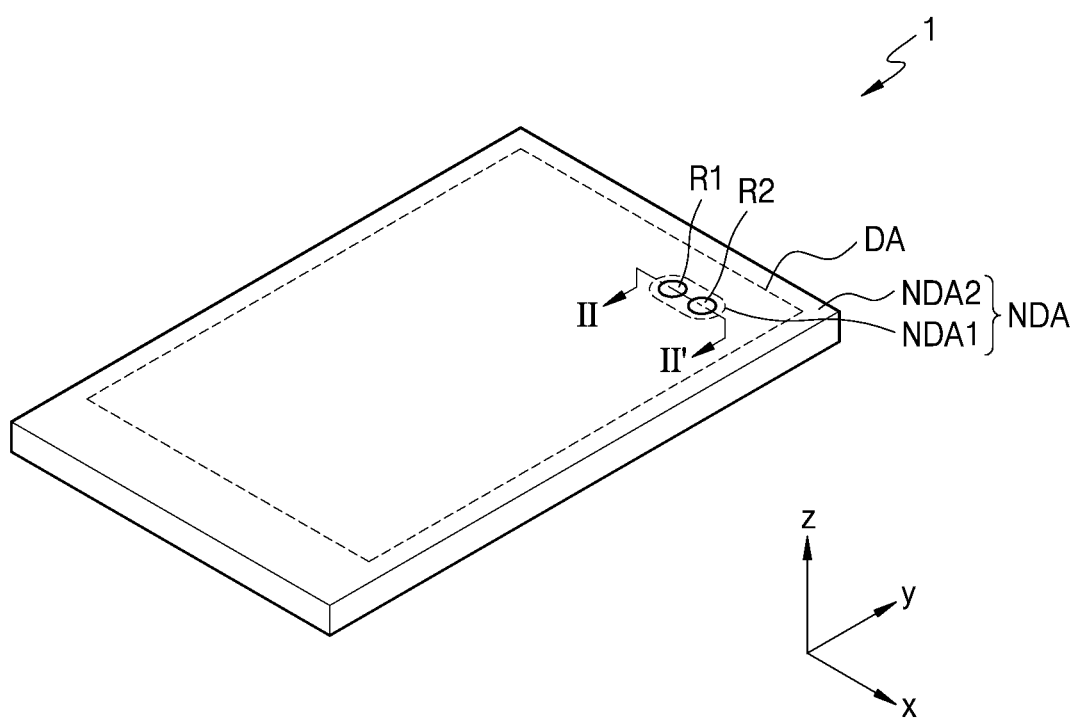
FIG. 1 is a perspective view of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the following examples, the x-axis, the y-axis, and the z-axis are not limited to the three axes of the rectangular coordinate system, and may be interpreted in a broader sense. For example, the x-axis, the y-axis, and the z-axis may represent directions that are perpendicular to or substantially perpendicular to one another, or may represent different directions that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

When an embodiment may be implemented differently, a certain process order may be performed differently from the described order. For example, two consecutively described processes may be performed at the same or substantially at the same time, or may be performed in an order opposite to the described order.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display apparatus 1 according to an embodiment.

Referring to FIG. 1, the display apparatus 1 includes a display area DA, and a non-display area NDA. The display area DA may be for emitting light, and the non-display area NDA may be for not emitting light.

The display apparatus 1 may display an image at (e.g., in or on) the display area DA. The display apparatus 1 may include any suitable display, for example, such as liquid crystal displays, electrophoretic displays, organic light-emitting displays, inorganic light-emitting displays, quantum-dot light-emitting displays, field-emission displays, surface-conduction electron-emitter displays, plasma displays, and/or cathode ray displays.

Hereinafter, although an organic light-emitting display apparatus is described in more detail as an example of the display apparatus 1 according to an embodiment, the present disclosure is not limited thereto. In other embodiments, various suitable kinds of display apparatuses may be used.

The display apparatus 1 includes a first region R1, and a second region R2. As described in more detail below with reference to FIG. 2A, the first region R1 and the second region R2 are locations (e.g., are areas) in which one or more electronic elements are arranged. The first region R1 and the second region R2 may be understood as opening areas or transmission areas through which light and/or sound that is output from the electronic element to the outside, or that progresses toward the electronic element from the outside, may pass. Although FIG. 1 shows that the first region R1 and the second region R2 correspond to two of the opening areas or the transmission areas, the present disclosure is not limited thereto, and three or more opening areas or transmission areas may be provided.

The first region R1 and the second region R2 may be identical to or substantially identical to each other, or may be different from each other. As an example, the first region R1 and the second region R2 may each have circular shapes having the same or substantially the same size as each other. In another embodiment, the first region R1 may have an elliptical shape, and the second region R2 may have a circular shape. In another embodiment, the first region R1 may have a polygonal shape, and the second region R2 may have an elliptical shape. However, the shapes and/or sizes of the first region R1 and the second region R2 are not limited to these examples, and the first region R1 and the second region R2 may have various suitable shapes that are the same as or different from each other. Hereinafter, for convenience of description, a case where the first region R1 and the second region R2 have the circular shape that are the same or substantially the same size as each other may be mainly described in more detail as an example.

In an embodiment, in the case where light passes through the first region R1 and the second region R2, light transmittance thereof may be 50% or more, for example, such as 70% or more, 75% or more, 80% or more, or 85% or more.

The non-display area NDA may include a first non-display area NDA1, and a second non-display area NDA2. The first non-display area NDA1 may surround (e.g., around a periphery of) the first region R1 and the second region R2, and the second non-display area NDA2 may surround (e.g., around a periphery of) the display area DA. The first non-display area NDA1 may entirely surround (e.g., around a periphery of) the first region R1 and the second region R2. The display area DA may surround (e.g., around a periphery of) at least a portion of an outline of the first non-display area NDA1. As an example, in an embodiment, the display area DA may entirely surround (e.g., around a periphery of) the outline of the first non-display area NDA1. In this case, the display area DA may surround (e.g., around a periphery of) at least three surfaces (e.g., at least three sides) of the first non-display area NDA1. In another embodiment, the display area DA may surround (e.g., around a periphery of) only a portion of the outline of the first non-display area NDA1. In an embodiment, in FIG. 1, the display area DA may surround at least two of a bottom, a lateral surface (e.g., a lateral side), and/or a top of the outline of the first non-display area NDA1. In this case, the first non-display area NDA1 may be connected to the second non-display area NDA2 through one or two of the bottom, the lateral surface (e.g., the lateral side), and/or the top thereof. As an example, in the case where the display area DA surrounds (e.g., around a periphery of) the bottom and the lateral surface (e.g., the lateral side) of the outline of the first non-display area NDA1, one of the top and/or the lateral surface (e.g., the lateral side) of the outline of the first non-display area NDA1 may be connected to the second non-display area NDA2. As another example, in the case where the display area DA surrounds (e.g., around a periphery of) the bottom and both lateral surfaces (e.g., both lateral sides) of the outline of the first non-display area NDA1, the top of the outline of the first non-display area NDA1 may be connected to the second non-display area NDA2.

The second non-display area NDA2 may surround (e.g., around a periphery of) at least a portion of an outline of the display area DA. As an example, in an embodiment, the second non-display area NDA2 may entirely surround (e.g., around a periphery of) the outline of the display area DA. In this case, the display area DA may be arranged inside the second non-display area NDA2. In another embodiment, the second non-display area NDA2 may surround (e.g., around a periphery of) only a portion of the outline of the display area DA. In this case, the second non-display area NDA2 may be arranged only at (e.g., in or on) a portion of the outline of the display area DA. Hereinafter, for convenience of description, a case in which the display area DA completely surrounds (e.g., around a periphery of) the outline of the first non-display area NDA1, and the second non-display area NDA2 completely surrounds (e.g., around a periphery of) the outline of the display area DA, may be mainly described in more detail as an example.

Although FIG. 1 shows that the first region R1 and the second region R2 are arranged at (e.g., in or on) an upper right portion of the display area DA, the present disclosure is not limited thereto. In other embodiments, the locations of the first region R1 and the second region R2 may be variously modified as needed or desired.

Figure 2A:
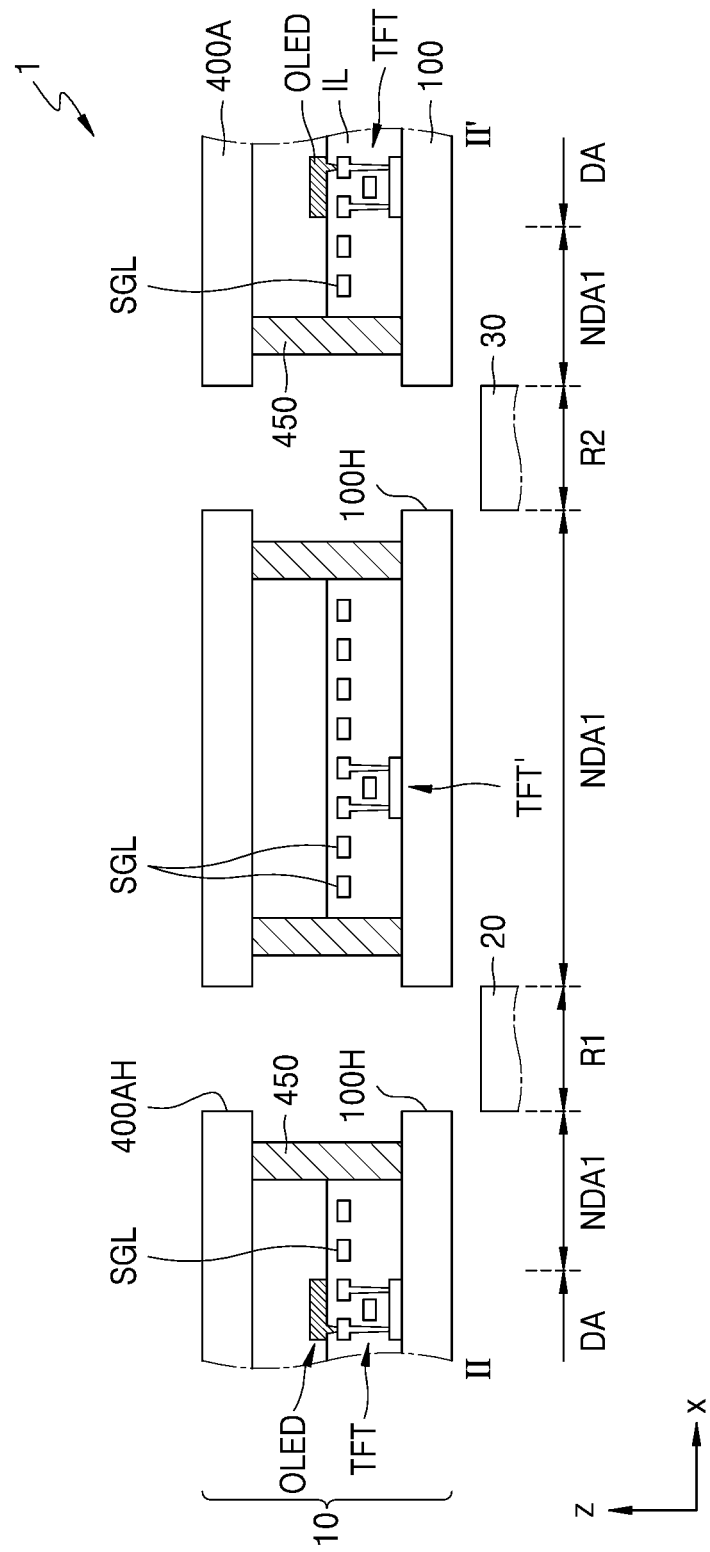
Figure 2B:
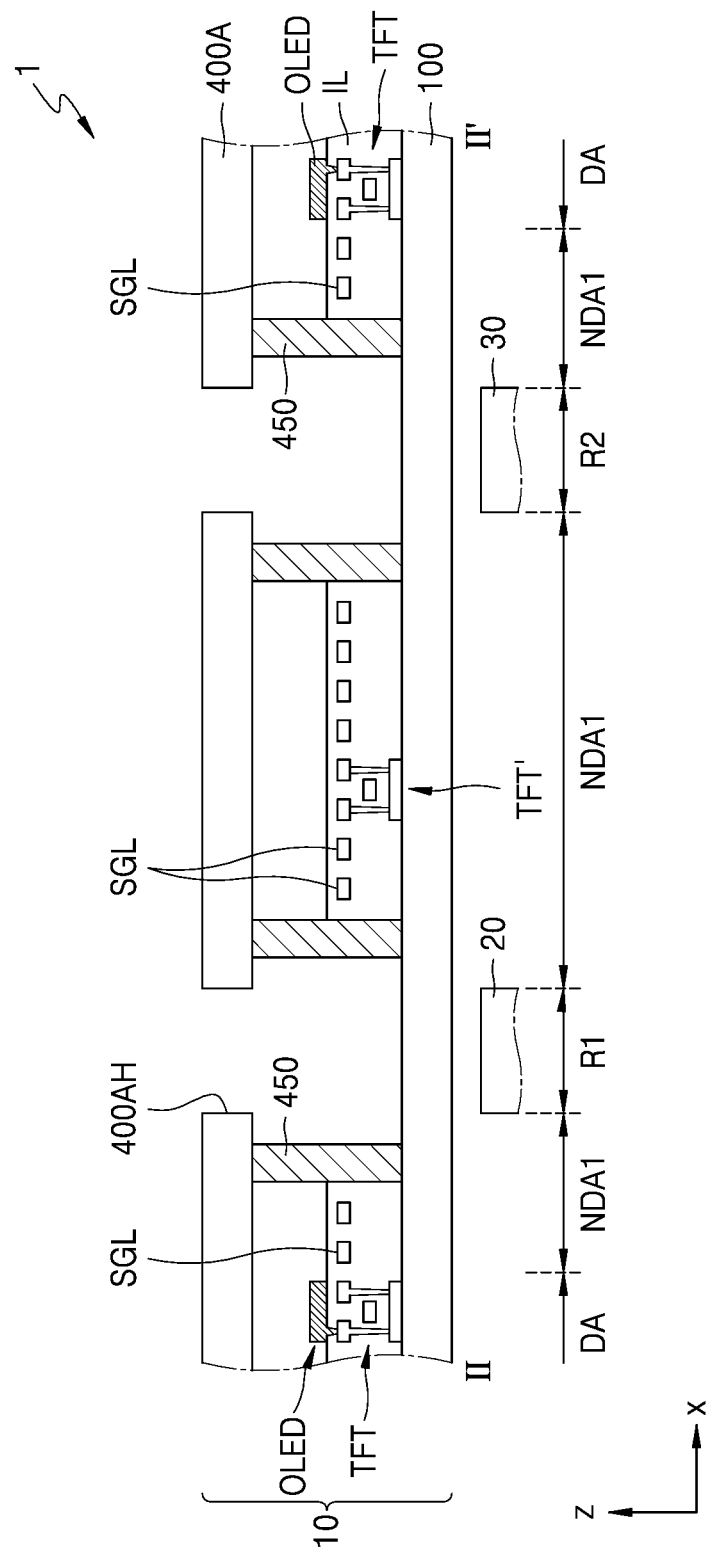

FIGS. 2A to 2C are cross-sectional views of the display apparatus 1 according to one or more embodiments. For example, FIGS. 2A to 2C are cross-sectional views taken along the line II-II' of FIG. 1.

Referring to FIG. 2A, the display apparatus 1 may include a display panel 10, a first electronic element 20, and a second electronic element 30. The display panel 10 may include a display element (e.g., an OLED). The first and second electronic elements 20 and 30 may correspond to the first and second regions R1 and R2, respectively, of the display panel 10. In some embodiments, various suitable elements, for example, such as an input sensing member (e.g., an input sensing layer), an anti-reflection member (e.g., an anti-reflection layer), and a transparent window, may be further arranged on the display panel 10. In this case, the input sensing member may sense a touch input, and the anti-reflection member may include a polarizer, a retarder, one or more color filters, and/or a black matrix.

The display panel 10 may include a substrate 100, an encapsulation substrate 400A, and a sealing member 450. The encapsulation substrate 400A may serve as an encapsulation member that faces the substrate 100, and the sealing member 450 may be between the substrate 100 and the encapsulation substrate 400A.

The substrate 100 may include glass or a polymer resin. The polymer resin may include, for example, polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and/or cellulose acetate propionate (CAP). The substrate 100 including the polymer resin may be flexible, rollable, and/or bendable. The substrate 100 may have a multi-layered structure including a layer including the polymer resin, and an inorganic layer. The encapsulation substrate 400A may include glass or the polymer resin.

A thin-film transistor TFT, an organic light-emitting diode OLED as the display element, and various signal lines SGL may be arranged at (e.g., in or on) the display area DA of the substrate 100. The organic light-emitting diode OLED may be connected to the thin-film transistor TFT. The signals lines SGL and dummy thin-film transistors TFT' may be arranged at (e.g., in or on) the first non-display area NDA1 of the substrate 100.

The signal lines SGL may provide a preset signal (e.g. a data signal, a scan signal, and/or the like) to the display elements (e.g., the OLEDs) that are spaced apart from each other in a y-direction around the first and second regions R1 and R2.

The display panel 10 may include through holes corresponding to the first and second regions R1 and R2, respectively. As an example, the substrate 100 and the encapsulation substrate 400A may include through holes 100H and 400AH, respectively. Portions of an insulating layer or elements corresponding to the first and second regions R1 and R2 between the substrate 100 and the encapsulation substrate 400A may be removed.

Although FIG. 2A shows that the sealing member 450 is arranged at (e.g., in or on) two opposite sides of each of the first and second regions R1 and R2 in a view from a direction perpendicular to or substantially perpendicular to a main surface of the substrate 100 (e.g., in a plan view), it may be understood that the first and second regions R1 and R2 are each entirely surrounded (e.g., around a periphery thereof) by the sealing member 450.

The first and second electronic elements 20 and 30 may be arranged at (e.g., in or on) the first and second regions R1 and R2, respectively. Each of the first and second electronic elements 20 and 30 may be an electronic element that uses light or sound. As an example, the electronic element may include a sensor, for example, such as an infrared sensor that emits and/or receives light, a camera that receives light to capture an image, a sensor that outputs and senses light or sound to measure a distance or to recognize a fingerprint, a small lamp that outputs light, a speaker that outputs sound, and/or the like. An electronic sensor that uses light may use light in various suitable wavelength bands including, for example, visible light, infrared light, and/or ultraviolet light.

In the case where the display panel 10 includes the through holes corresponding to the first and second regions R1 and R2 as shown in FIG. 2A, light or sound that is output from and/or received by the first and second electronic elements 20 and 30 may be more effectively utilized.

Unlike the display panel 10 including the through holes corresponding to the first and second regions R1 and R2 as shown in FIG. 2A, in some embodiments, some elements of the display panel 10 may not include through holes. As an example, as shown in FIG. 2B, the encapsulation substrate 400A may include the through holes 400AH corresponding to the first and second regions R1 and R2, but the substrate 100 may not include the through holes 100H. As another example, as shown in FIG. 2C, in some embodiments, both the substrate 100 and the encapsulation substrate 400A may not include the through holes (e.g., 100H and 400AH) corresponding to the first and second regions R1 and R2. Although the substrate 100 may not include the through hole 100H as shown in FIGS. 2B and 2C, light transmittance for the first and second electronic elements 20 and 30 may be secured by removing a portion of an insulating layer IL or elements corresponding to the first and second regions R1 and R2 between the substrate 100 and the encapsulation substrate 400A. In the case where the display apparatus 1 includes the display panel 10 shown in FIGS. 2B and 2C, electronic elements that are configured to use light may be used as the first and second electronic elements 20 and 30.

Figure 3A:
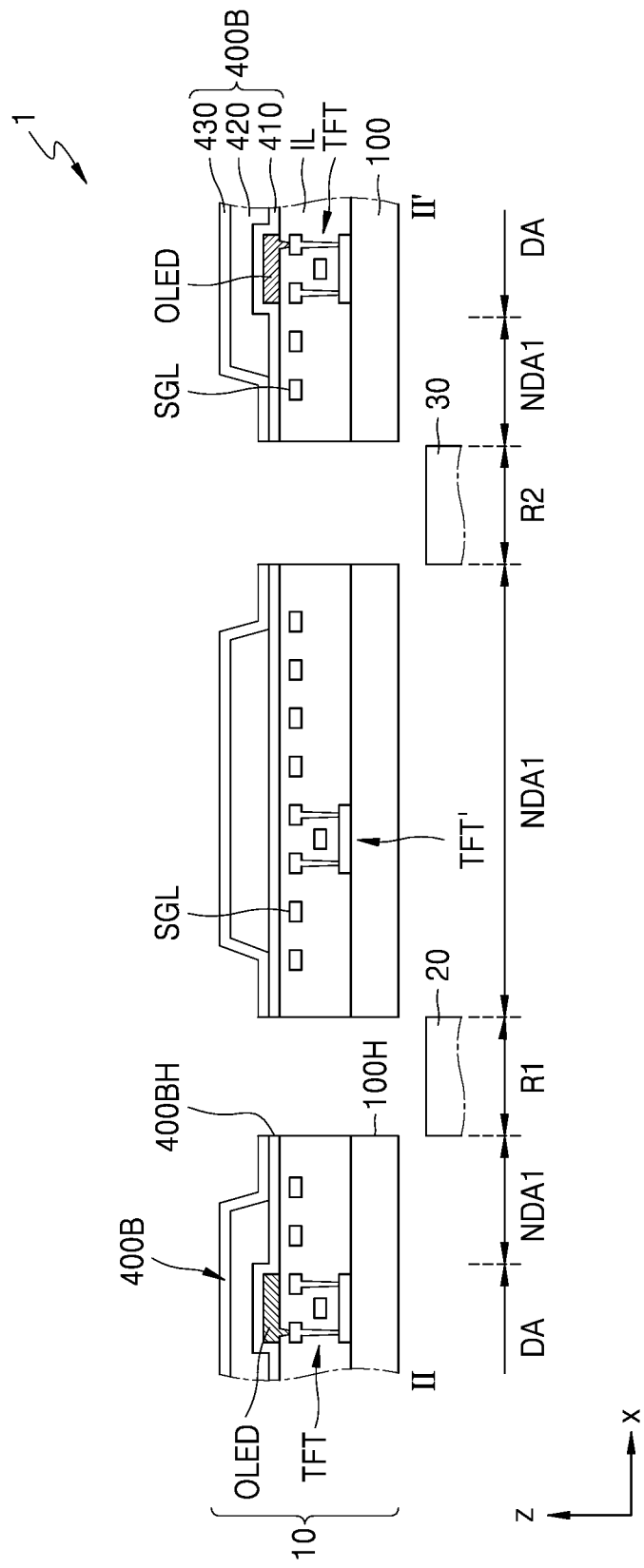
FIGS. 3A-3C are cross-sectional views of a display apparatus according to one or more embodiments.
Figure 3B:
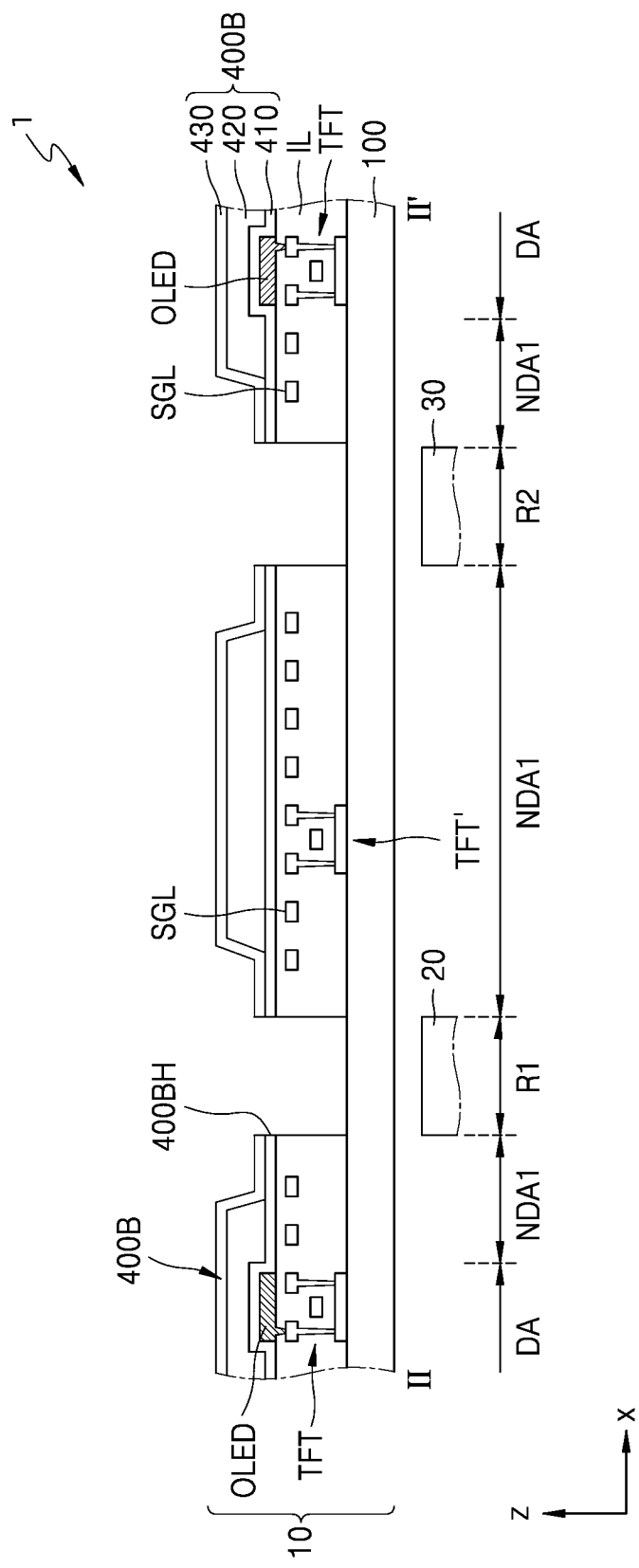
Figure 3C:
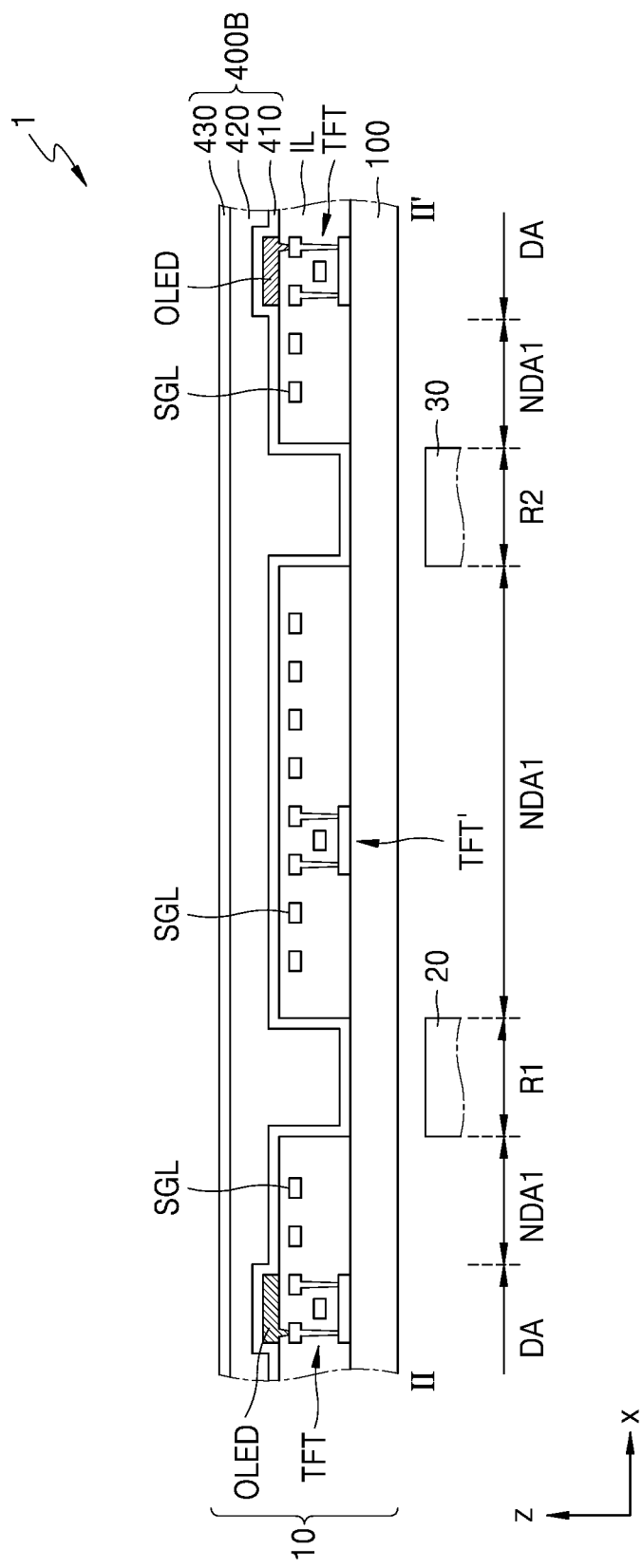

FIGS. 3A to 3C are cross-sectional views of the display apparatus 1 according to one or more embodiments. For example, FIGS. 3A to 3C are cross-sectional views taken along the line II-II' of FIG. 1.

Referring to FIG. 3A, similar to the display apparatus 1 described above with reference to FIG. 2A, the display apparatus 1 of FIG. 3A may include the display panel 10, the first electronic element 20, and the third electronic element 30. The display panel 10 includes a display element (e.g., an OLED), and the first and second electronic elements 20 and 30 may correspond to the first and second regions R1 and R2, respectively, of the display panel 10. In addition, in some embodiments, the display apparatus 1 may further include an input sensing member (e.g., an input sensing layer), an anti-reflection member (e.g., an anti-reflection layer), and a window, each arranged on the display panel 10. The input sensing member may sense a touch input.

Unlike the display panel 10 described above with reference to FIG. 2A, which includes the encapsulation substrate 400A as an encapsulation member and the sealing member 450, the display panel 10 according to the present embodiment of FIG. 3A may include a thin-film encapsulation layer 400B. In this case, the flexibility of the display panel 10 may be further improved. Hereinafter, for convenience of description, the differences between the embodiments of FIGS. 2A and 3A are mainly described, and redundant description thereof may not be repeated.

The thin-film encapsulation layer 400B may include at least one inorganic encapsulation layer, and at least one organic encapsulation layer. For example, FIG. 3A shows first and second inorganic encapsulation layers 410 and 430, and an organic encapsulation layer 420 between the first and second inorganic encapsulation layers 410 and 430.

The first and second inorganic encapsulation layers 410 and 430 may include at least one inorganic insulating material selected from among aluminum oxide, titanium oxide, tantalum oxide, hafnium oxide, zinc oxide, silicon oxide, silicon nitride, and silicon oxynitride. The organic encapsulation layer 420 may include a polymer-based material. The polymer-based material may include, for example, an acryl-based resin, an epoxy-based resin, polyimide, and/or polyethylene.

The display panel 10 may include through holes corresponding to the first and second regions R1 and R2. As an example, the substrate 100 and the thin-film encapsulation layer 400B may include the through hole 100H and a through hole 400BH, respectively, corresponding to the first and second regions R1 and R2. As described above, the first and second electronic elements 20 and 30 that use light or sound may be arranged at (e.g., in or on) the first and second regions R1 and R2.

Unlike the display panel 10 including the through holes corresponding to the first and second regions R1 and R2 as shown in FIG. 3A, in some embodiments, some of the elements of the display panel 10 may not include the through holes. For example, as shown in FIG. 3B, the thin-film encapsulation layer 400B may include the through holes 400BH corresponding to the first and second regions R1 and R2, but the substrate 100 may not include the through holes 100H. As another example, as shown in FIG. 3C, in some embodiments, both the substrate 100 and the thin-film encapsulation layer 400B may not include the through holes (e.g., 100H and 400BH) corresponding to the first and second regions R1 and R2. Although the substrate 100 may not include the through hole 100H as shown in FIGS. 3B and 3C, light transmittance for the first and second electronic elements 20 and 30 may be secured by removing a portion of an insulating layer IL or elements corresponding to the first and second regions R1 and R2 between the substrate 100 and the thin-film encapsulation substrate 400B.

In the case where the thin-film encapsulation substrate 400B includes the through hole 400BH as shown in FIGS. 3A and 3B, each of the at least one inorganic encapsulation layer and the at least one organic encapsulation layer may include a hole corresponding to the through hole 400BH. In this case, the hole of the organic encapsulation layer (e.g., 420) may be formed to be larger than the holes of the inorganic encapsulation layers (e.g., 410 and 430), and thus, the first and second inorganic encapsulation layers 410 and 430 may contact each other (e.g., may directly contact each other) around the first and second regions R1 and R2.

In the case where the thin-film encapsulation layer 400B does not include the through hole (e.g., 400BH) as shown in FIG. 3C, the at least one inorganic encapsulation layer and the at least one organic encapsulation layer may each cover the first and second regions R1 and R2. In this case, a portion of the insulating layer IL between the substrate 100 and the thin-film encapsulation layer 400B may be removed. Although FIG. 3C shows that the portion of the insulating layer IL corresponding to the first and second regions R1 and R2 is completely removed, in some embodiments, the portion of the insulating layer IL, which has a multi-layered structure, may be partially removed (e.g., only some layers of the insulating layer IL may be removed).

Figure 4:
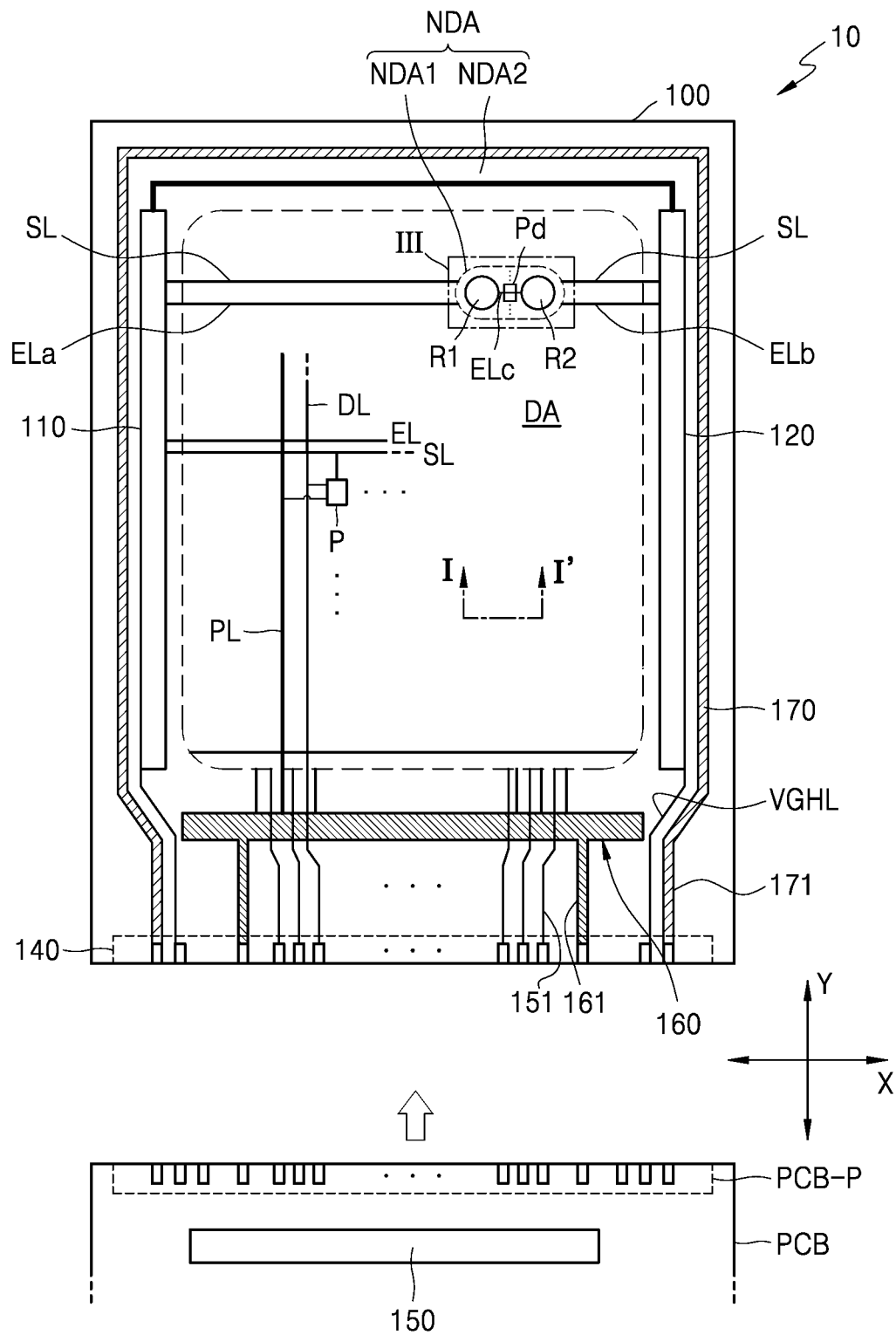
FIG. 4 is a plan view of a portion of a display panel according to an embodiment.
Figure 5A:
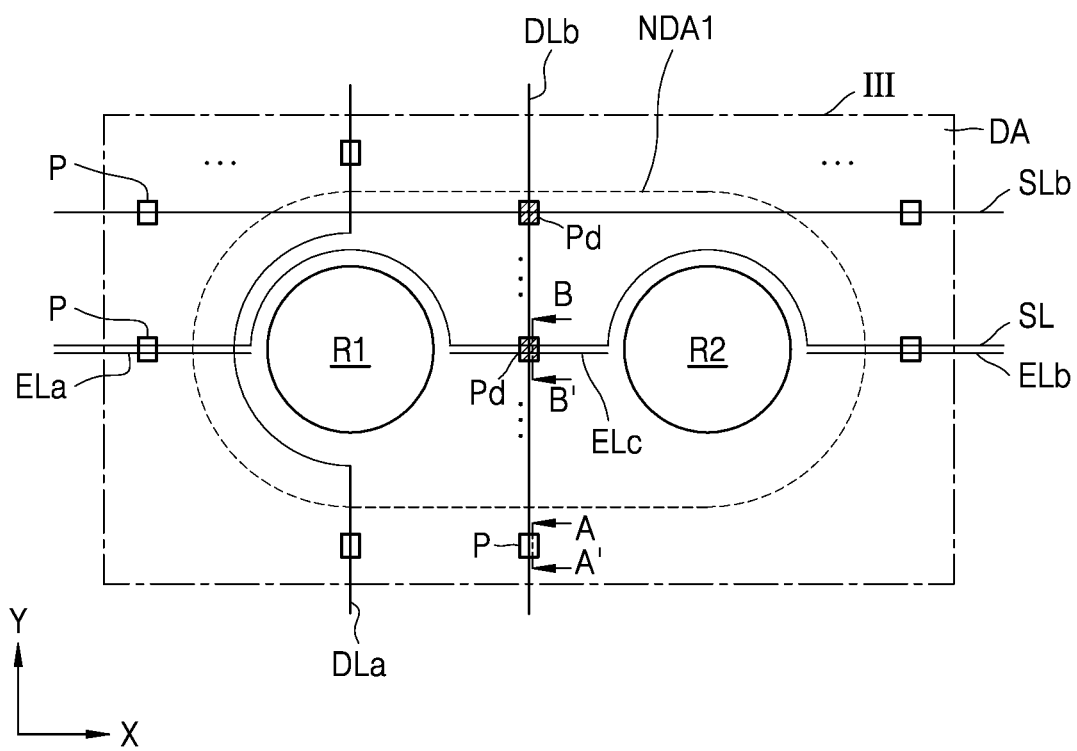
FIGS. 5A-5B are plan views of a portion of the display panel corresponding to the region III of FIG. 4.
Figure 5B:
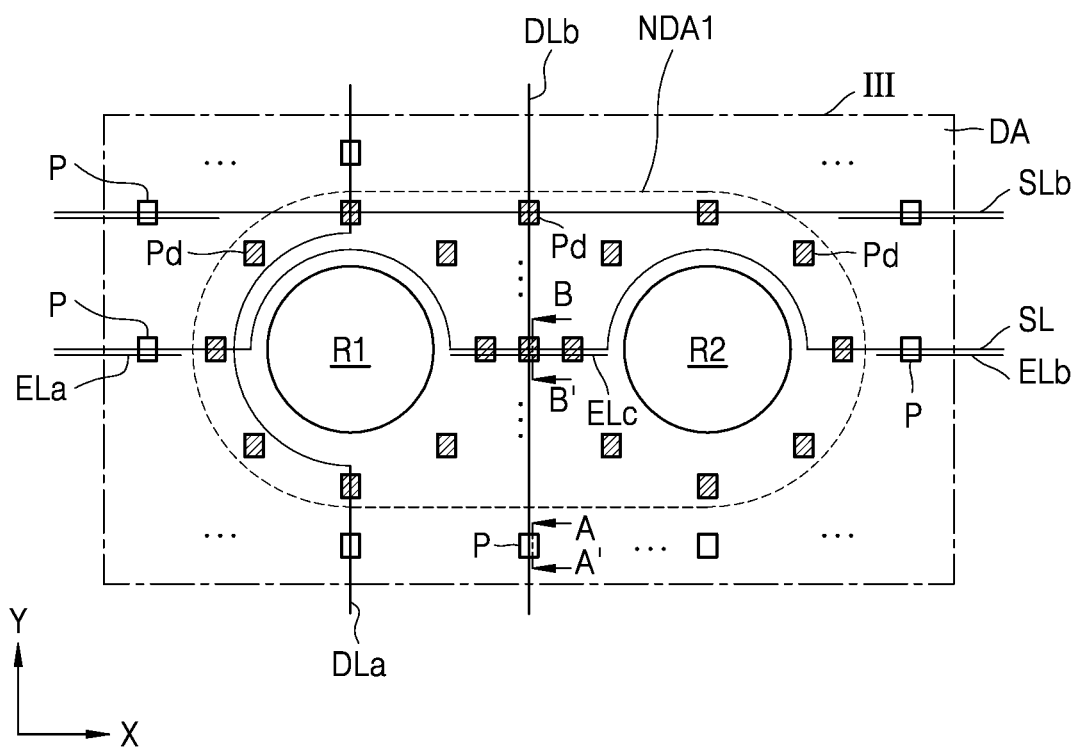

FIG. 4 is a plan view of the display panel 10 according to an embodiment, and FIGS. 5A and 5B are plan views of a portion of the display panel 10 corresponding to the region III of FIG. 4.

Referring to FIGS. 4 to 5B, the display panel 10 includes a plurality of pixels P arranged at (e.g., in or on) the display area DA. Each of the pixels P may include a display element, for example, such as an organic light-emitting diode OLED. A pixel P from among the pixels P may emit, for example, red light, green light, blue light, or white light from a corresponding organic light-emitting diode OLED. As used in the present specification, a pixel P may be understood as a pixel that emits red light, green light, blue light, or white light. The display area DA may be protected from external air, moisture, and/or the like by being covered by the encapsulation member (e.g., the encapsulation substrate 400A or the encapsulation layer 400B) described above with reference to FIGS. 2A to 3C.

The first non-display area NDA1 surrounds (e.g., around a periphery of) the first and second regions R1 and R2, concurrently (e.g., simultaneously). The first non-display area NDA1 may be a region at (e.g., in or on) which an image is not displayed. Signal lines that provide a signal to the pixels P around the first and second regions R1 and R2 may be arranged at (e.g., in or on) the first non-display area NDA1. In addition, dummy pixels Pd that do not emit light may be arranged at (e.g., in or on) the first non-display area NDA1.

A first driving circuit unit (e.g., a first driver circuit) 110, a second driving circuit unit (e.g., a second driver circuit) 120, a terminal unit (e.g., a terminal circuit, a terminal area, or a pad area) 140, a data driving circuit 150, a first power supply line 160, and a second power supply line 170 may be arranged at (e.g., in or on) the second non-display area NDA2. The first driving circuit unit 110 and the second driving circuit unit 120 may provide a scan signal and an emission control signal to the pixels P and the dummy pixels Pd.

The first driving circuit unit 110 may provide a scan signal to each pixel P connected thereto through a corresponding scan line SL. The first driving circuit unit 110 may provide an emission control signal to each pixel P connected thereto through a corresponding emission control line EL. The second driving circuit unit 120 may be arranged in parallel to or substantially in parallel to the first driving circuit unit 110, with the display area DA therebetween. Some of the pixels P arranged at (e.g., in or on) the display area DA may be electrically connected to the first driving circuit unit 110, and others (e.g., the rest or the remaining ones) of the pixels P may be electrically connected to the second driving circuit unit 120.

The first driving circuit unit 110 may be connected to the second driving circuit unit 120 through a driver power line VGHL. The driver power line VGHL may be provided in a plurality, and each of the driver power lines VGHL may transmit a gate driving high voltage Vgh, a gate driving low voltage Vgl, a start signal FLM, and/or the like. The gate driving high voltage Vgh and the gate driving low voltage Vgl may be voltages for driving the first driving circuit unit 110 and the second driving circuit unit 120. The first driving circuit unit 110 is connected to the second driving circuit unit 120 through the driver power line VGHL, and thus, a brightness deviation of the display apparatus 1 may be reduced.

The terminal unit 140 may be arranged on a side (e.g., on one side) of the substrate 100. The terminal unit 140 may be exposed, and may be electrically connected to a printed circuit board PCB by not being covered by an insulating layer. A terminal PCB-P of the printed circuit board PCB may be electrically connected to the terminal unit 140 of the display panel 10. The printed circuit board PCB transfers a signal of a controller or power to the display panel 10. A control signal generated by the controller may be transferred to the first and second driving circuit units 110 and 120 through the printed circuit board PCB. The controller may provide a driving voltage ELVDD and a common voltage ELVSS (e.g., see FIGS. 7A and 7B) to the first and second power supply lines 160 and 170 through first and second connection lines 161 and 171, respectively.

The driving voltage ELVDD may be provided to each pixel P through a driving voltage line PL connected to the first power supply line 160, and the common voltage ELVSS may be provided to an opposite electrode of the pixel P that is connected to the second power supply line 170. The second power supply line 170 may have a loop shape having one open side, and may partially surround (e.g., around a periphery of) the display area DA.

The data driving circuit 150 is electrically connected to a data line DL. A data signal of the data driving circuit 150 may be provided to each pixel P through a corresponding connection line 151 and a corresponding data line DL. The connection line 151 may be connected to the terminal unit 140, and the data line DL may be connected to the connection line 151. Although FIG. 4 shows that the data driving circuit 150 is arranged on the printed circuit board PCB, the present disclosure is not limited thereto, and the data driving circuit 150 may be arranged on the substrate 100. As an example, the data driving circuit 150 may be arranged between the terminal unit 140 and the first power supply line 160.

The first power supply line 160 may be connected to the first connection line 161, and may receive the driving voltage ELVDD from the controller connected to the terminal unit 140. The first power supply line 160 may be arranged to correspond to all pixel columns, which may be arranged along a first direction (e.g., an X-axis direction), and may transfer the driving voltage ELVDD to each of the pixel columns.

In the present embodiment, the scan line SL at (e.g., in or on) the left side of the first non-display area NDA1 may be spaced apart from the scan line SL at (e.g., in or on) the right side of the first non-display area NDA1, with the first non-display area NDA1 therebetween. In another embodiment, the scan line SL at (e.g., in or on) the left side of the first non-display area NDA1 and the scan line SL at (e.g., in or on) the right side of the first non-display area NDA1 may pass through the first non-display area NDA1. In this case, a connection portion where the scan line SL at (e.g., in or on) the left side of the first non-display area NDA1 is connected to the scan line SL at (e.g., in or on) the right side of the first non-display area NDA1 may be arranged at (e.g., in or on) the first non-display area NDA1. The connection portion of the scan line SL may detour (e.g., may extend around) the first region R1 and the second region R2. Hereinafter, for convenience of description, the case where the scan line SL at (e.g., in or on) the left side of the first non-display area NDA1 is connected to the scan line SL at (e.g., in or on) the right side of the first non-display area NDA1 is mainly described in more detail.

A first emission control line ELa at (e.g., in or on) the left side of the first non-display area NDA1 may be spaced apart from a second emission control line ELb at (e.g., in or on) the right side of the first non-display area NDA1, with the first non-display area NDA1 therebetween.

The scan line SL and the first emission control line ELa may be connected to the first driving circuit unit 110, and may extend in the first direction (e.g., a (+) X-axis direction). The scan line SL and the second emission control line ELb may be connected to the second driving circuit unit 120, and may extend in a direction opposite to the first direction (e.g., a (−) X-axis direction). In this case, the scan line SL may cross the first non-display area NDA1. In more detail, the scan line SL may not overlap with the first and second regions R1 and R2 by detouring (e.g., by extending around) the first and second regions R1 and R2. On the other hand, the first emission control line ELa and the second emission control line ELb may be disconnected from each other at (e.g., in or on) the first non-display area NDA1. In this case, a third emission control line ELc may be arranged at (e.g., in or on) the first non-display area NDA1. The third emission control line ELc may be arranged at (e.g., in or on) the dummy pixel Pd, and may be disconnected from other lines that are outside the first non-display area NDA1.

The first driving circuit unit 110 and the second driving circuit unit 120 may be arranged at (e.g., in or on) long sides of the substrate 100. In another embodiment, the first driving circuit unit 110 and the second driving circuit unit 120 may face each other at (e.g., in or on) short sides of the substrate 100. Hereinafter, for convenience of description, the case where each of the first and second driving circuit units 110 and 120 is arranged at (e.g., in or on) a corresponding long side of the substrate 100 is mainly described in more detail.

The first and second driving circuit units 110 and 120 may include a scan driver, and an emission control driver. The scan driver may generate a scan signal, and the emission control driver may generate an emission control signal.

The first driving circuit unit 110 and the second driving circuit unit 120 may be connected to the driver power line VGHL to receive the driving power. In this case, the driver power line VGHL may be connected to the first driving circuit unit 110 and the second driving circuit unit 120, or may be arranged between the first driving circuit unit 110 and the long side of the substrate 100 and between the second driving circuit unit 120 and the long side of the substrate 100 and connected to the first driving circuit unit 110 and the second driving circuit unit 120.

FIGS. 5A and 5B are enlarged plan views of a portion of the display panel 10 corresponding to the region III of FIG. 4.

Referring to FIGS. 5A and 5B, the first region R1 and the second region R2 are arranged along the first direction (e.g., the X-axis direction). The first non-display area NDA1 surrounds (e.g., around a periphery of) the first region R1 and the second region R2, and the display area DA surrounds (e.g., around a periphery of) the first non-display area NDA1.

The plurality of pixels P are arranged at (e.g., in or on) the display area DA, and the plurality of dummy pixels Pd are arranged at (e.g., in or on) the first non-display area NDA1. A plurality of signal lines may electrically connect the plurality of pixels P to the plurality of dummy pixels Pd. For example, as shown in FIG. 5A, the scan lines SL extending in the first direction (e.g., the X-axis direction) may connect the pixels P at (e.g., in or on) the display area DA to the dummy pixels Pd at (e.g., in or on) the first non-display area NDA1, and the data lines DLa and DLb may connect the pixels P to the dummy pixels Pd in a second direction (e.g., a Y-axis direction) crossing the first direction.

Some of the scan lines SL may extend in the first direction (e.g., the X-axis direction) to provide a signal to the pixels P at (e.g., in or on) the left and right sides of the first non-display area NDA1, and to provide the signal to the dummy pixels Pd at (e.g., in or on) the first non-display area NDA1, and may detour (e.g., may extend around) the edges of the first region R1 and the second region R2 at (e.g., in or on) the first non-display area NDA1. At (e.g., in or on) the first non-display area NDA1, some scan lines SLb that are arranged away from the first region R1 and the second region R2, or the scan lines that do not pass across the first non-display area NDA1, may extend in a straight or substantially straight line.

Some data lines DLa from among the data lines DLa and DLb may extend in the second direction (e.g., the Y-axis direction) to provide a signal to the pixels P at (e.g., in or on) top and bottom sides of the first non-display area NDA1, and may detour (e.g., may extend around) the edges of the first region R1 and the second region R2 at (e.g., in or on) the first non-display area NDA1. At (e.g., in or on) the first non-display area NDA1, some data lines DLb from among the data lines DLa and DLb that are arranged between the first region R1 and the second region R2, or the data lines that do not pass across the first non-display area NDA1, may extend in a straight or substantially straight line.

As an example, in the case where the first region R1 and the second region R2 are provided in a circular shape, the signal lines that are closer to the first region R1 and the second region R2 may be curved to have a larger curvature along the edges of the first region R1 and the second region R2, and the signal lines that are arranged away from the first region R1 and the second region R2 may extend in a straight line shape.

The emission control lines ELa, ELb, and ELc may extend in the first direction, and may include the first and second emission control lines ELa and ELb that are connected to the pixels P at (e.g., in or on) the display area DA. In addition, the emission control lines ELa, ELb, and ELc may include the third emission control line ELc that is connected to at least one of the dummy pixels Pd arranged at (e.g., in or on) the first non-display area NDA1. In this case, the third emission control line ELc may not be connected to the first and second emission control lines ELa and ELb.

In the present embodiment, the dummy pixels Pd arranged at (e.g., in or on) the first non-display area NDA1 may be configured to not emit light even when the dummy pixels Pd receive an electric signal through the signal lines.

In the present embodiment, the dummy pixels Pd may be provided to secure an evenness of a pattern density and an evenness of an electric load. When the dummy pixels Pd are not arranged at (e.g., in or on) the first non-display area NDA1, and the signal lines SL, DLa, DLb, ELa, and ELb for connecting the pixels P at (e.g., in or on) the display area DA are arranged at (e.g., in or on) the first non-display area NDA1, a pattern density of the first non-display area NDA1 may be reduced, and thus, patterns may be formed unevenly during an etching process.

In addition, when the dummy pixels Pd are not arranged at (e.g., in or on) the first non-display area NDA1, a parasitic capacitance or a load formed in the first non-display area NDA1 and around the first non-display area NDA1 may be different from a parasitic capacitance or a load formed in a central portion of the display area DA. Accordingly, uneven brightness may occur.

In the present embodiment, the first non-display area NDA1 may include an auxiliary pixel circuit PC' having the same or substantially the same structure as that of a pixel circuit PC of the pixel P, such that an electric signal is applied to the auxiliary pixel circuit PC', and thus, pattern density evenness and electric load evenness may be concurrently (e.g., simultaneously) secured.

The dummy pixel Pd may be arranged between the first region R1 and the second region R2 at (e.g., in or on) the first non-display area NDA1 as shown in FIG. 5A. However, the present disclosure is not limited thereto.

As an example, as shown in FIG. 5B, the dummy pixels Pd may surround (e.g., around a periphery of) the first region R1 and/or the second region R2. In other words, the dummy pixels Pd may be arranged at (e.g., in or on) regions that neighbor (e.g., that are adjacent to) the display area DA on the left side, the top side, and the bottom side of the first region R1, as well as between the first region R1 and the second region R2. In addition, the dummy pixels Pd may be arranged at (e.g., in or on) regions that neighbor (e.g., that are adjacent to) the display area DA on the right side, the top side, and the bottom side of the second region R2.

When the dummy pixels Pd are arranged to surround (e.g., around a periphery of) the first region R1 and/or the second region R2, the dummy pixels Pd may be arranged between the pixels P and the first region R1, and/or between the pixels P and the second region R2. Accordingly, the dummy pixels Pd may protect the pixels P at (e.g., in or on) the display area DA from an electrostatic discharge that may occur around the first region R1 and/or the second region R2. In other words, in the case where electrostatic discharge occurs around the first region R1 and/or the second region R2, the dummy pixels Pd may serve as a buffer, and thus, a high voltage due to the electrostatic discharge may not be transferred to the pixels P.

FIGS. 6A to 6D are cross-sectional views of a pixel P and a dummy pixel Pd according to one or more embodiments.

Figure 6A:
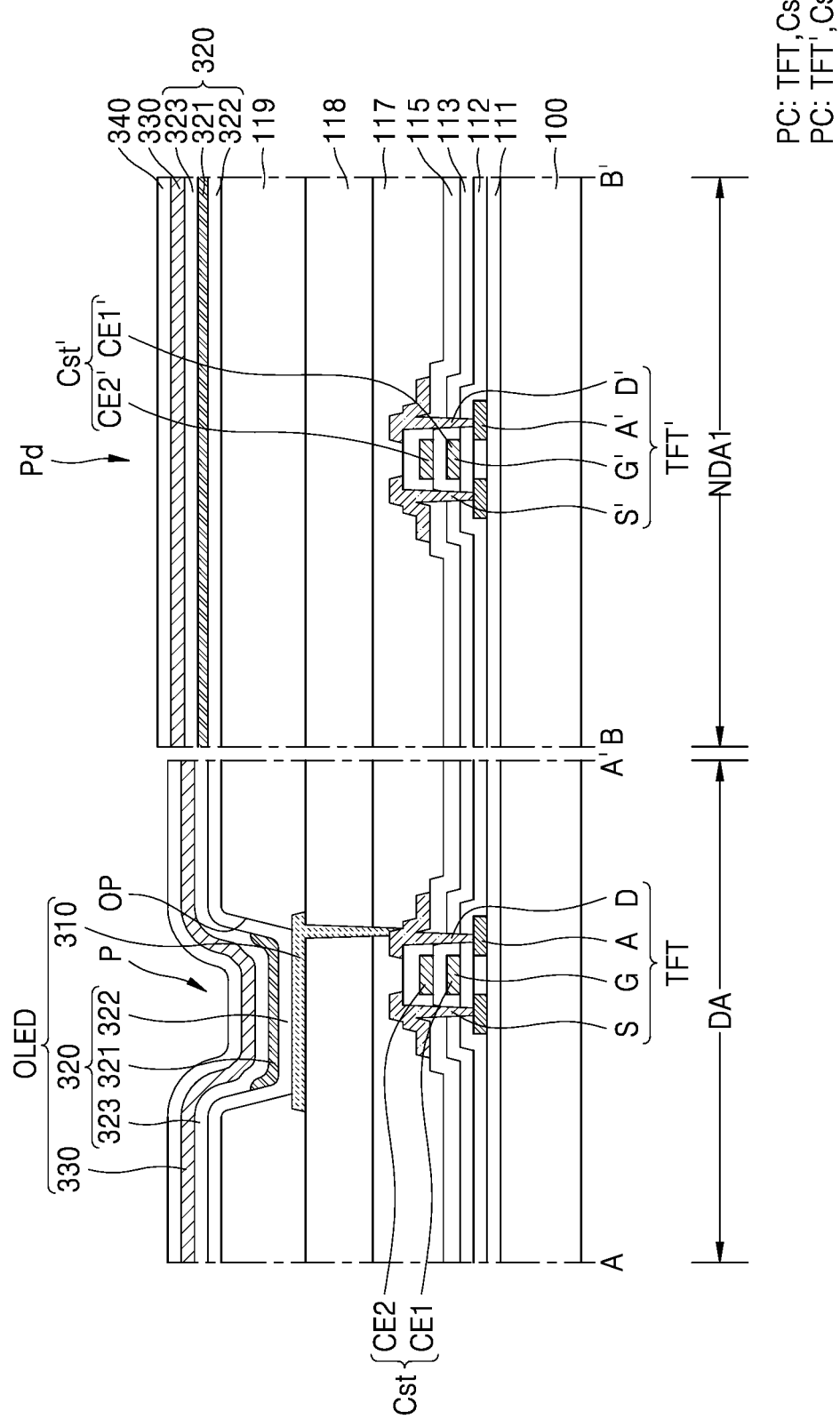
FIGS. 6A-6D are cross-sectional views of a pixel and a dummy pixel according to one or more embodiments.

Referring to FIG. 6A, the pixel P may include a pixel circuit PC, and an organic light-emitting diode OLED as a display element. The pixel circuit PC may include at least one thin-film transistor TFT. The dummy pixel Pd may include an auxiliary pixel circuit PC' including at least one dummy thin-film transistor TFT'. In an embodiment, the pixel circuit PC and the auxiliary pixel circuit PC' may have the same or substantially the same structure as each other.

The dummy pixel Pd may be configured to not emit light even when an electric signal is applied to the auxiliary pixel circuit PC', because a portion of a display element is removed or omitted at the dummy pixel Pd.

In the present embodiment, the dummy pixel Pd implements non-light emission by not including a pixel electrode 310 of an organic light-emitting diode OLED, as compared to the pixel P. However, the present disclosure is not limited thereto. For example, in some embodiments, an opposite electrode 330 may not be arranged at (e.g., in or on) a region where the dummy pixel Pd is located. Thus, various suitable modifications may be made, as would be understood to those having ordinary skill in the arts.

Though FIG. 6A shows one of the thin-film transistors TFT and TFT' of the pixel circuit PC and the auxiliary pixel circuit PC', respectively, the present disclosure is not limited thereto. For example, the thin-film transistors TFT and TFT' may be provided in a plurality. As an example, two to seven thin-film transistors TFT and TFT' may be provided for each of the pixel circuit PC and the auxiliary pixel circuit PC'. Thus, various suitable modifications may be made, as would be understood to those having ordinary skill in the arts.

Hereinafter, structures of the pixel P and the dummy pixel Pd are described in more detail in a stacking order thereof.

The substrate 100 may include a glass material, a ceramic material, a metal material, or a flexible and/or bendable material. In the case where the substrate 100 is flexible and/or bendable, the substrate 100 may include a polymer resin, for example, such as polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), and/or cellulose acetate propionate (CAP). The substrate 100 may have a single layer structure or a multi-layered structure including one or more of the above materials. In the case where the substrate 100 has a multi-layered structure, the substrate 100 may further include an inorganic layer. In an embodiment, the substrate 100 may have a structure of an organic material/an inorganic material/an organic material.

A buffer layer 111 may be arranged on the substrate 100 to reduce or block the penetration of foreign substances, moisture, and/or external air from below the substrate 100. The buffer layer 111 may provide a flat or substantially flat surface on the substrate 100. The buffer layer 111 may include an inorganic material, for example, such as an oxide or a nitride, an organic material, or an organic/inorganic composite material. The buffer layer 111 may have a single-layer structure, or a multi-layered structure of an inorganic material and an organic material.

In some embodiments, a barrier layer may be further arranged between the substrate 100 and the buffer layer 111. The barrier layer may prevent or reduce the penetration of impurities from the substrate 100 and/or the like into semiconductor layers A and A'. The barrier layer may include an inorganic material, for example, such as an oxide or a nitride, an organic material, or an organic/inorganic composite material. The barrier layer may have a single-layer structure, or a multi-layered structure of an inorganic material and an organic material.

The semiconductor layers A and A' may be arranged on the buffer layer 111. The semiconductor layers A and A' may include amorphous silicon or polycrystalline silicon. In another embodiment, the semiconductor layers A and A' may include an oxide including at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and/or zinc (Zn). In an embodiment, the semiconductor layers A and A' may include a Zn-oxide-based material, for example, such as Zn-oxide, In—Zn oxide, and/or Ga—In—Zn oxide. In another embodiment, the semiconductor layers A and A' may include In—Ga—Zn—O (IGZO), In—Sn—Zn—O (ITZO), or In—Ga—Sn—Zn—O (IGTZO) semiconductor including a metal, for example, such as indium (In), gallium (Ga), and/or stannum (Sn) in ZnO. The semiconductor layers A and A' may include a channel region, a source region, and a drain region. The source region and the drain region may be at (e.g., in or on) two opposite sides of the channel region, respectively. The semiconductor layers A and A' may include a single layer structure or a multi-layered structure.

Gate electrodes G and G' are arranged over the semiconductor layers A and A', such that the gate electrodes G and G' at least partially overlap with the semiconductor layers A and A' with a first gate insulating layer 112 therebetween. The gate electrodes G and G' may include at least one of molybdenum (Mo), aluminum (Al), copper (Cu), and/or titanium (Ti), and may have a single layer structure or a multi-layered structure. As an example, the gate electrodes G and G' may include a single Mo layer.

The first gate insulating layer 112 may include silicon oxide ($SiO_2$), silicon nitride ($SiN_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$).

A second gate insulating layer 113 may cover the gate electrodes G and G'. The second gate insulating layer 113 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$).

First storage capacitor plates CE1 and CE1' of storage capacitors Cst and Cst' may overlap with the thin-film transistors TFT and TFT', respectively. As an example, the gate electrodes G and G' of the thin-film transistors TFT and TFT' may serve as the first storage capacitor plates CE1 and CE1' of the storage capacitors Cst and Cst', respectively.

Second storage capacitor plates CE2 and CE2' of the storage capacitors Cst and Cst' overlap with the first storage capacitor plates CE1 and CE1' of the storage capacitors Cst and Cst', respectively, with the second gate insulating layer 113 therebetween. In this case, the second gate insulating layer 113 may serve as dielectric layers of the storage capacitors Cst and Cst'. The second storage capacitor plates CE2 and CE2' may include a conductive material including molybdenum (Mo), aluminum (Al), copper (Cu), and/or titanium (Ti). The second storage capacitor plates CE2 and CE2' may have a single layer structure or a multi-layered structure including one or more of the above materials. As an example, the second storage capacitor plates CE2 and CE2' may include a single Mo layer, or multi-layers of Mo/Al/Mo.

Although the figures show that the storage capacitors Cst and Cst' overlap with the thin-film transistors TFT and TFT', the present disclosure is not limited thereto. For example, in some embodiments, the storage capacitors Cst and Cst' may not overlap with the thin-film transistors TFT and TFT'. Thus, various suitable modifications may be made, as would be understood by those having ordinary skill in the arts.

An interlayer insulating layer 115 may be provided to cover the second storage capacitor plates CE2 and CE2' of the storage capacitors Cst and Cst'. The interlayer insulating layer 115 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$).

Source electrodes S and S' and drain electrodes D and D' may be arranged on the interlayer insulating layer 115. The source electrodes S and S' and the drain electrodes D and D' may include a conductive material including molybdenum (Mo), aluminum (Al), copper (Cu), and/or titanium (Ti). The source electrodes S and S' and the drain electrodes D and D' may have a single layer structure or a multi-layered structure including one or more of the above materials. As an example, the source electrodes S and S' and the drain electrodes D and D' may have a multi-layered structure of Ti/Al/Ti.

A planarization layer may be arranged on the source electrodes S and S' and the drain electrodes D and D'. In this case, at least one planarization layer may be provided. Hereinafter, for convenience of description, an embodiment in which the planarization layer includes a first planarization layer 117 and a second planarization layer 118 is described in more detail.

The first planarization layer 117 and the second planarization layer 118 are arranged. An organic light-emitting diode OLED may be arranged on a pixel region of the second planarization layer 118. In an embodiment, the second planarization layer 118 may be omitted.

The first planarization layer 117 and the second planarization layer 118 may have a flat or substantially flat top surface, such that the pixel electrode 310 may be formed to be flat or substantially flat. The first planarization layer 117 and the second planarization layer 118 may include a single layer structure or a multi-layered structure including an organic material layer. The first planarization layer 117 and the second planarization layer 118 may include a general-purpose polymer, for example, such as benzocyclobutene (BCB), polyimide, hexamethyldisiloxane (HMDSO), polymethylmethacrylate (PMMA), or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The first planarization layer 117 and the second planarization layer 118 may include an inorganic material. The first planarization layer 117 and the second planarization layer 118 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$). In the case where the first planarization layer 117 and the second planarization layer 118 include an inorganic material, chemical planarization polishing may be performed as needed or desired depending on the case. The first planarization layer 117 may include both an organic material and an inorganic material.

At (e.g., in or on) the display area DA of the substrate 100, the organic light-emitting diode OLED is arranged on the second planarization layer 118. The organic light-emitting diode OLED includes the pixel electrode 310, an intermediate layer 320, and the opposite electrode 330. The intermediate layer 320 includes an organic emission layer.

The first planarization layer 117 and the second planarization layer 118 may include a via hole. The via hole exposes one of the source electrode S and the drain electrode D of the thin-film transistor TFT. The pixel electrode 310 is electrically connected to the thin-film transistor TFT by contacting one of the source electrode S and the drain electrode D through the via hole.

The pixel electrode 310 may be a transparent or semi-transparent electrode, or a reflective electrode. In an embodiment, the pixel electrode 310 may include a reflective layer, and a transparent or semi-transparent electrode layer on the reflective layer. The reflective layer may include at least one of Ag, Mg, Al, Pt, Pd, Au, Ni, Nd, Ir, Cr, and/or a compound thereof. The transparent or semi-transparent electrode layer may include at least one of indium tin oxide (ITO), indium zinc oxide (IZO), zinc oxide (ZnO), indium oxide (In$_2$O$_3$), indium gallium oxide (IGO), and/or aluminum zinc oxide (AZO). In an embodiment, the pixel electrode 310 may have a stacked structure of ITO/Ag/ITO.

A pixel-defining layer 119 may be arranged on the second planarization layer 118. The pixel-defining layer 119 may define an emission area of the pixel P by including an opening OP corresponding to each pixel electrode 310 at (e.g., in or on) the display area DA. The opening OP exposes at least a central portion of the pixel electrode 310. In addition, the pixel-defining layer 119 may prevent or substantially prevent the occurrence of an arc and/or the like from occurring at edges of the pixel electrode 310, by increasing a distance between the edges of the pixel electrode 310 and the opposite electrode 330 over the pixel electrode 310. The pixel-defining layer 119 may be formed through spin coating and/or the like by using an organic insulating material, for example, such as polyimide, polyamide, an acrylic resin, benzocyclobutene, HMDSO, and/or a phenolic resin.

The pixel P, or in other words, an emission area of the pixel P, may be defined by the opening OP of the pixel-defining layer 119. In other words, the edges of the pixel P may denote the edges of the opening OP of the pixel-defining layer 119. In addition, the edges of the opening OP of the pixel-defining layer 119 may denote a boundary of the pixel electrode 310 exposed by the opening OP.

The intermediate layer 320 of the organic light-emitting diode OLED may include an organic emission layer 321, a first common layer 322, and a second common layer 323. The first common layer 322 and the second common layer 323 being arranged under and on the organic emission layer 321.

The organic emission layer 321 may include an organic material including a fluorescent or a phosphorous material that emits red light, green light, blue light, or white light. The organic emission layer 321 may include a low molecular weight organic material or a polymer organic material.

The first common layer 322 may include a hole injection layer (HIL) and/or a hole transport layer (HTL). The second common layer 323 may include an electron transport layer (ETL) and/or an electron injection layer (EIL).

The intermediate layer 320 may be arranged to correspond to each of the plurality of pixel electrodes 310. However, the present disclosure is not limited thereto. The intermediate layer 320 may include a layer provided as one body over the plurality of pixel electrodes 310, for example, such as the first common layer 322 and/or the second common layer 323. Thus, various suitable modifications may be made, as would be understood to those having ordinary skill in the arts. However, the present disclosure is not limited thereto, and the first common layer 322 and/or the second common layer 323 may be omitted.

The opposite electrode 330 may be a transparent electrode or a reflective electrode. In an embodiment, the opposite electrode 330 may be a transparent or semi-transparent electrode, and may include a metal thin film having a work function including Li, Ca, LiF/Ca, LiF/Al, Al, Ag, Mg, and/or compound thereof. In addition, a transparent conductive oxide (TCO) layer including ITO, IZO, ZnO, or $In_2O_3$ may be further arranged on the metal thin film. The opposite electrode 330 is arranged over the display area DA and the peripheral area PA, and arranged on the intermediate layer 320 and the pixel-defining layer 119. The opposite electrode 330 may be formed as one body over the plurality of organic light-emitting diodes OLED to correspond to the plurality of pixel electrodes 310.

In the case where the pixel electrode 310 is provided as a reflective electrode, and the opposite electrode 330 is provided as a light-transmissive electrode, light emitted from the intermediate layer 320 is emitted toward the opposite electrode 330, and thus, the display apparatus may be a top-emission display apparatus. In the case where the pixel electrode 310 is a transparent or semi-transparent electrode, and the opposite electrode 330 is a reflective electrode, light emitted from the intermediate layer 320 is emitted toward the substrate 100, and thus, the display apparatus may be a bottom-emission display apparatus. However, the present disclosure is not limited thereto. For example, the display apparatus according to some embodiments may be a dual-emission display apparatus that emits light in two directions toward the top and the bottom.

Unlike the pixel P, the dummy pixel Pd arranged at (e.g., in or on) the first non-display area NDA1 of the substrate 100 does not include a pixel electrode. The pixel-defining layer 119 may not include an opening corresponding to the dummy pixel Pd. In other words, the pixel-defining layer 119 may have a flat or substantially flat top surface corresponding to the dummy pixel Pd. This is because the pixel-defining layer 119 includes an organic material, and may be formed through exposure and hardening, and thus, may not contribute to unevenness by pattern density.

The intermediate layer 320 may be arranged on the pixel-defining layer 119 at (e.g., in or on) the region of the dummy pixel Pd. Even though the intermediate layer 320 is arranged, the dummy pixel Pd does not include a pixel electrode, and thus, light-emission from the intermediate layer 320 does not occur at the dummy pixel Pd.

Although FIG. 6A shows that all of the organic emission layer 321, the first common layer 322, and the second common layer 323 of the intermediate layer 320 are arranged at (e.g., in or on) the region of the dummy pixel Pd, like those of the intermediate layer 320 arranged at (e.g., in or on) the pixel P, the present disclosure is not limited thereto.

Figure 6B:
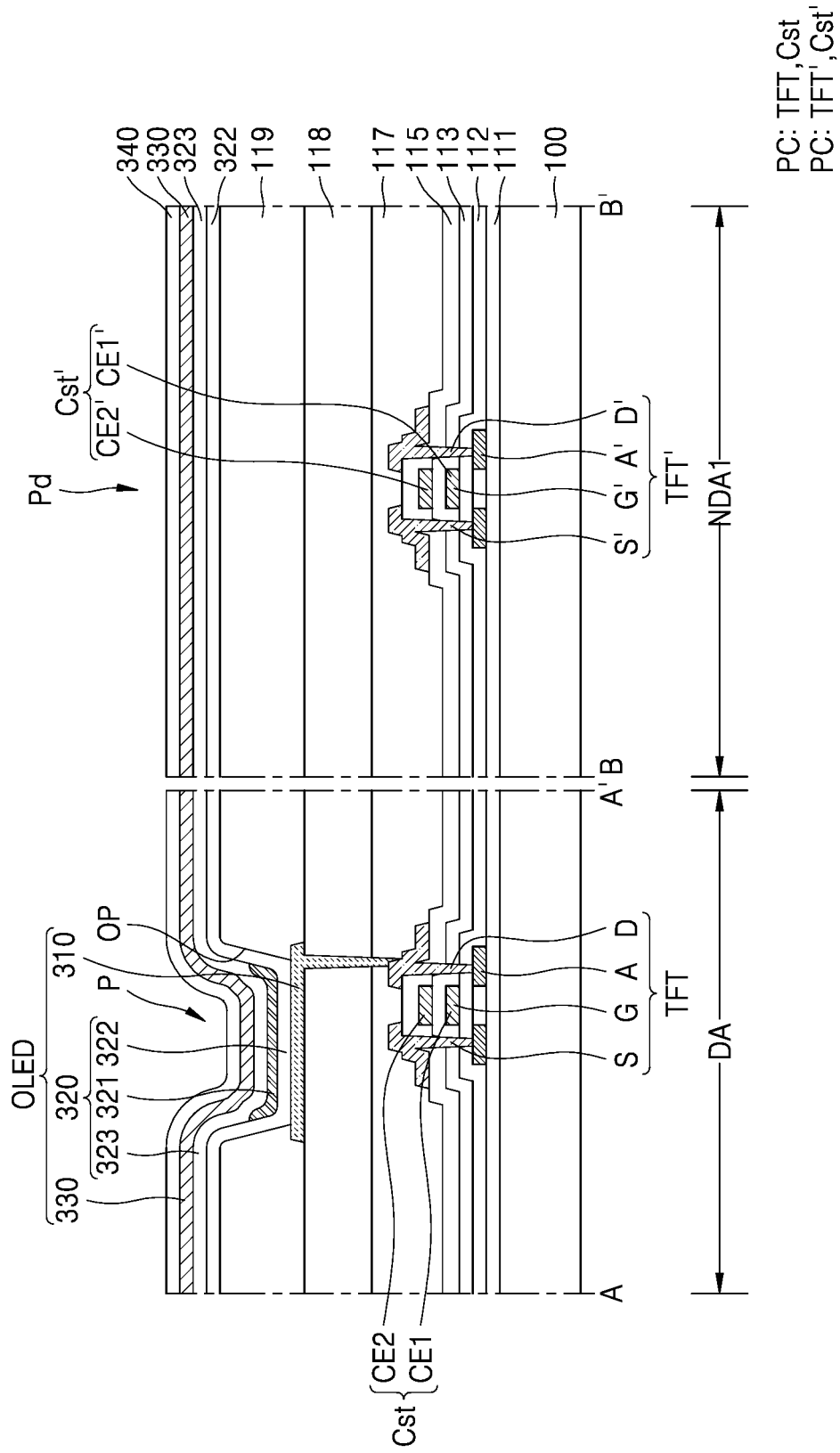

For example, as shown in FIG. 6B, the organic emission layer 321, the first common layer 322, and the second common layer 323 may be arranged at (e.g., in or on) the region of the pixel P. In comparison, only the first common layer 322 and the second common layer 323 of the intermediate layer 320 may be arranged at (e.g., in or on) the region of the dummy pixel Pd without the organic emission layer 321. In this case, the first common layer 322 may contact (e.g., may directly contact) the second common layer 323 at (e.g., in or on) the region of the dummy pixel Pd.

Figure 6C:
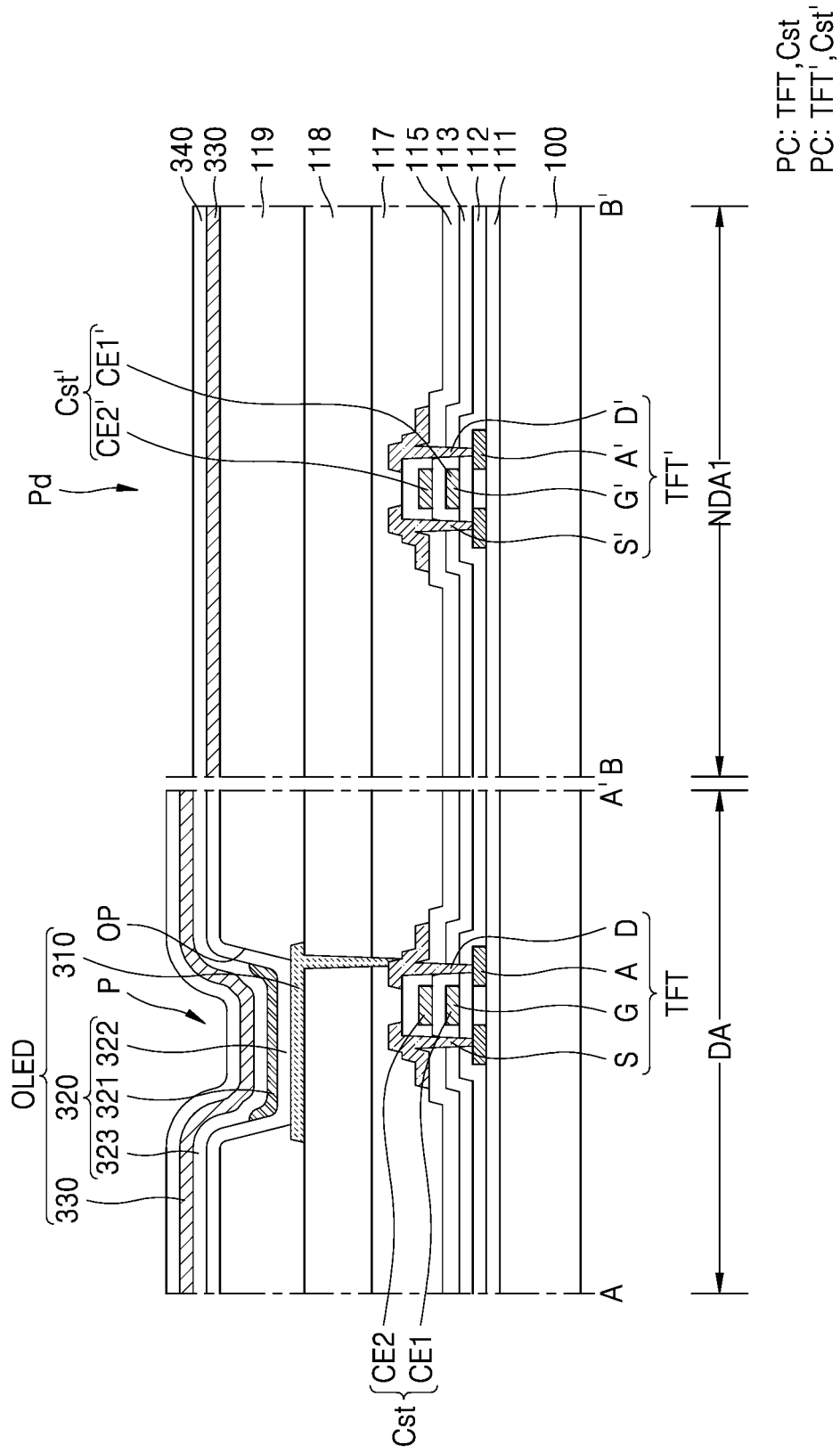

As another example, as shown in FIG. 6C, the intermediate layer 320 may be arranged at (e.g., in or on) the region of the pixel P, and the intermediate layer 320 may not be arranged at (e.g., in or on) the region of the dummy pixel Pd. In this case, the opposite electrode 330 may contact (e.g., may directly contact) the top surface of the pixel-defining layer 119 at (e.g., in or on) the region of the dummy pixel Pd. Thus, various suitable modifications may be made, as would be understood by those having ordinary skill in the arts.

Figure 6D:
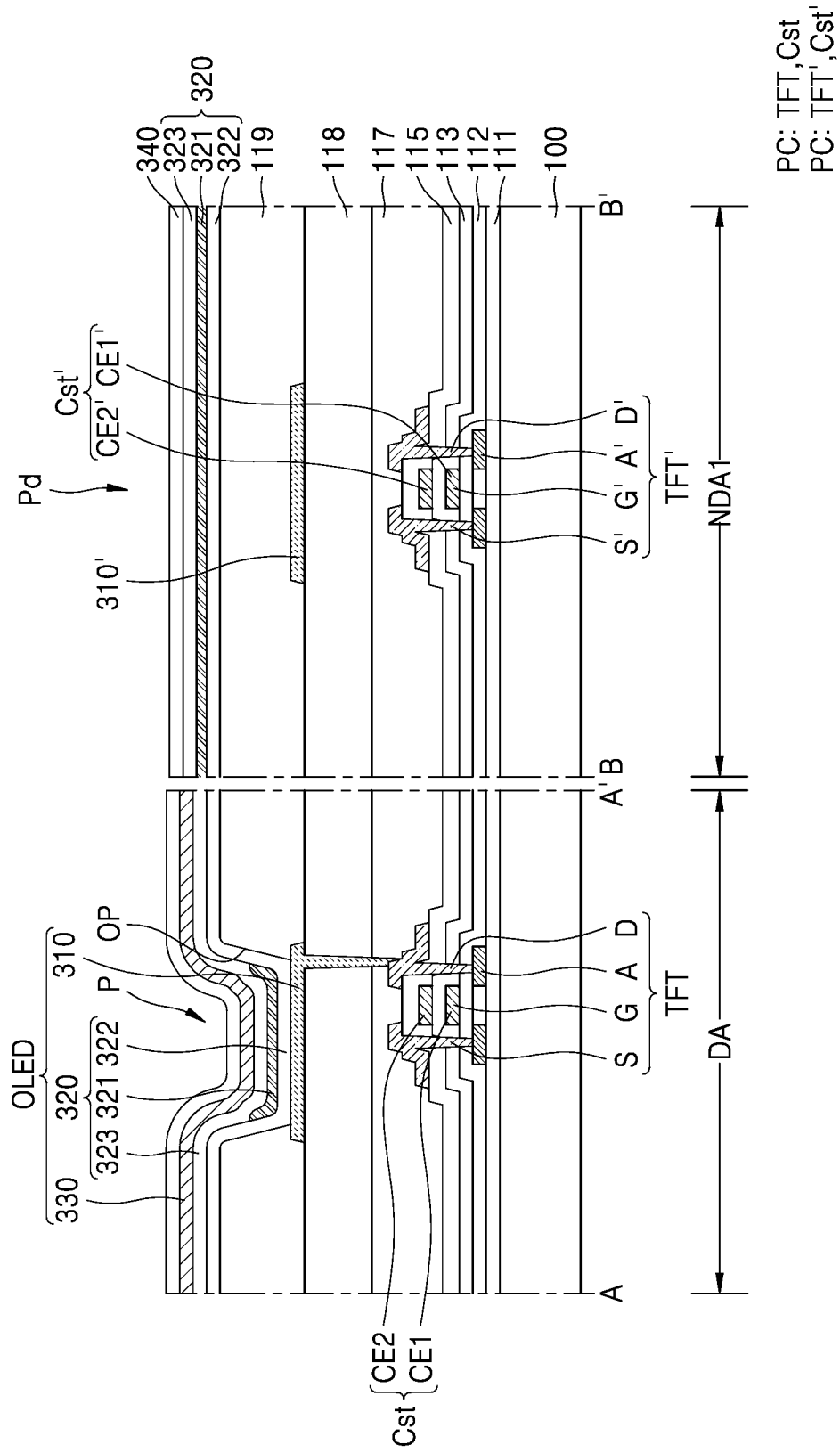

Although FIGS. 6A to 6C show that the opposite electrode 330 is arranged in common such that the opposite electrode 330 is also arranged at (e.g., in or on) the region of the dummy pixel Pd, the present disclosure is not limited thereto. As an example, as shown in FIG. 6D, the opposite electrode 330 may not be arranged to correspond to the dummy pixel Pd. In this case, as shown in FIG. 6D, a conductive layer 310', the organic emission layer 321 of the intermediate layer 320, the first common layer 322, and the second common layer 323 may be arranged at (e.g., in or on) the dummy pixel Pd. The conductive layer 310' may be arranged at (e.g., in or on) the same layer as that of the pixel electrode 310, and may include the same or substantially the same material as that of the pixel electrode 310. However, the present disclosure is not limited thereto. For example, in some embodiments, at least one of the conductive layer 310', the organic emission layer 321, the first common layer 322, and/or the second common layer 323 may be omitted from the region of the dummy pixel Pd.

Because the opposite electrode 330 may be formed over the entire display panel through an open mask, it may be desired in the process of forming the opposite electrode 330 that the opposite electrode 330 is arranged to correspond to the pixel P and the dummy pixel Pd.

A capping layer 340 may be arranged on the opposite electrode 330. The capping layer 340 has a lower refractive index than that of the opposite electrode 330. The capping layer 340 may improve light efficiency by reducing a rate at which light generated from the intermediate layer 320 including the organic emission layer 321 is totally reflected, and thus, is not emitted to the outside.

As an example, the capping layer 340 may include an organic material, such as poly(3,4-ethylenedioxythiophene) (PEDOT), 4,4'-bis [N-(3-methyl phenyl)-N-phenyl amino] biphynyl (TPD), 4,4',4"-tris[(3-methyl phenyl) phenyl amino]triphenyl amine (m-MTDATA), 1,3,5-tris[N,N-bis (2-methylphenyl)-amino]-benzen (o-MTDAB), 1,3,5-tris [N,N-bis(3-methylphenyl)-amino]-benzen (m-MTDAT), 1,3,5-tris [N,N-bis(4-methylphenyl)-amino]-benzen (p-MTDAB), 4,4'-bis [N,N-bis(3-methylphenyl)-amino]-diphenyl methane (BPPM), 4,4'-dicarbazolyl-1,1'-biphenyl (CBP), 4,4',4"-tris (N-carbazol) triphenyl amine (TCTA), 2,2',2"-(1,3,5-benzenetolyl) tris-[1-phenyl-1H-benzoimidazole](TPBI), and/or 3-(4-biphenyl)-4-phenyl-5-t-butylphenyl-1,2,4-triazole (TAZ).

In addition, the capping layer 340 may include an inorganic material, for example, such as zinc oxide, titanium oxide, zirconium oxide, silicon nitride, niobium oxide, tantalum oxide, tin oxide, nickel oxide, indium nitride, and/or gallium nitride. A material of the capping layer 340 is not limited thereto, and may include various suitable materials.

In some embodiments, a cover layer may be arranged on the capping layer 340. The cover layer protects the organic light-emitting diode OLED from damage that may occur during a subsequent process that uses plasma and/or the like. For example, the cover layer may include lithium fluoride (LiF).

Figure 6E:
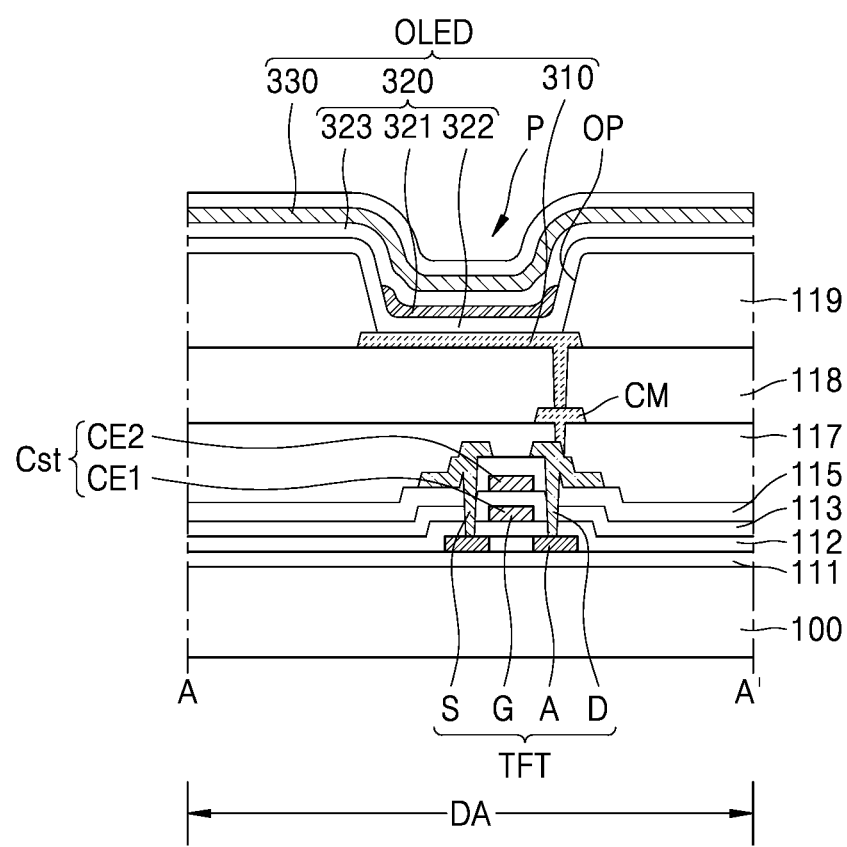
FIGS. 6E-6F are cross-sectional views of a pixel according to one or more embodiments.
Figure 6F:
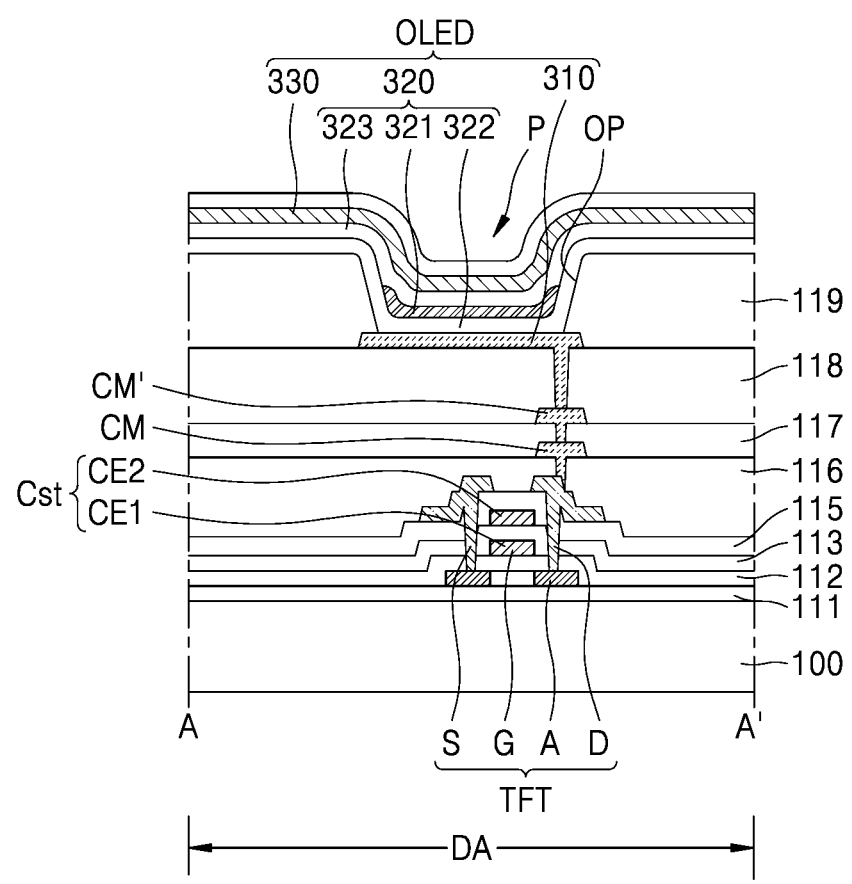

FIGS. 6E and 6F are cross-sectional views of a pixel according to one or more embodiments.

Referring to FIG. 6E, the pixel P may include a plurality of planarization layers. For example, as shown in FIG. 6E, in the case where the plurality of planarization layers include the first planarization layer 117 and the second planarization layer 118, a connection metal CM may be arranged between the first planarization layer 117 and the second planarization layer 118. The connection metal CM may connect the pixel electrode 310 of the organic light-emitting diode OLED to the thin-film transistor TFT.

Referring to FIG. 6F, in the case where the plurality of planarization layers include the first planarization layer 117, the second planarization layer 118, and a third planarization layer 116, a connection metal may be provided in a plurality. In this case, the plurality of connection metals may include a first connection metal CM and a second connection metal CM'. The first connection metal CM may be between the third planarization layer 116 and the first planarization layer 117, and the second connection metal CM' may be between the first planarization layer 117 and the second planarization layer 118. In this case, the first connection metal CM may connect the thin-film transistor TFT to the second connection metal CM', and the second connection metal CM' may connect the first connection metal CM to the pixel electrode 310.

Figure 7A:
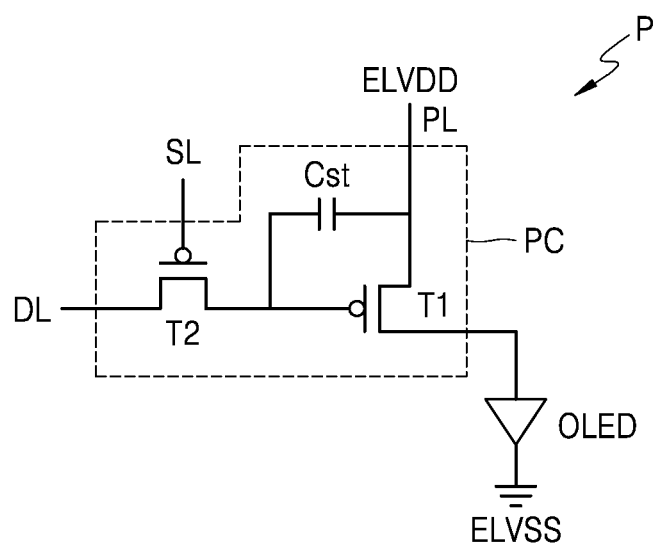
FIGS. 7A-7B are equivalent circuit diagrams of a pixel according to one or more embodiments.
Figure 7B:
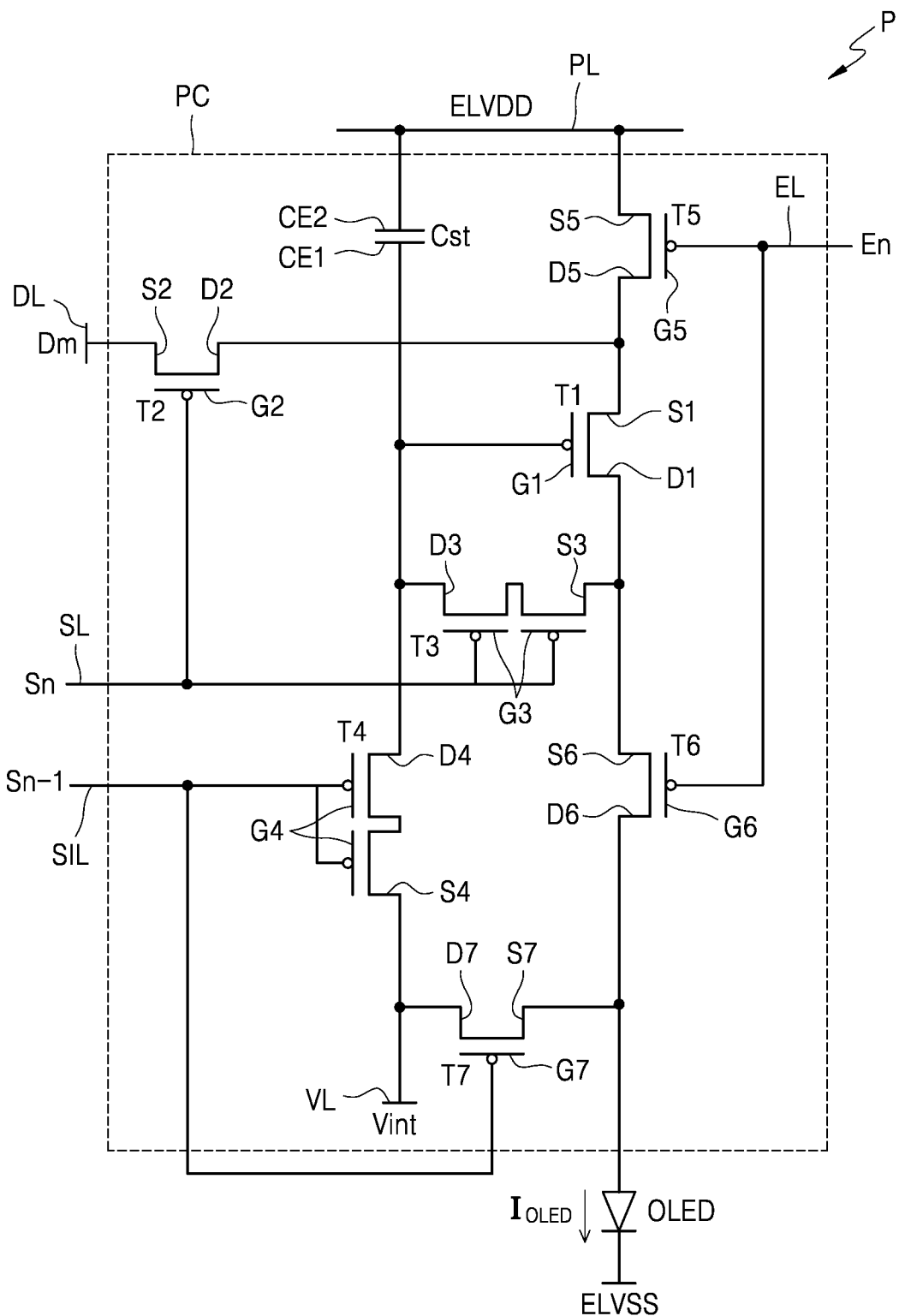

FIGS. 7A and 7B are equivalent circuit diagrams of a pixel of a display panel according to one or more embodiments.

Referring to FIG. 7A, each pixel P includes the pixel circuit PC, and the organic light-emitting diode OLED connected to the pixel circuit PC. The pixel circuit PC may include a driving thin-film transistor T1, a switching thin-film transistor T2, and a storage capacitor Cst.

The switching thin-film transistor T2 is connected to the scan line SL and the data line DL, and transfers a data voltage input from the data line DL to the driving thin-film transistor T1 according to a switching voltage input from the scan line SL. The storage capacitor Cst is connected to the switching thin-film transistor T2 and the driving voltage line PL, and stores a voltage corresponding to a difference between a voltage transferred from the switching thin-film transistor T2 and the driving voltage ELVDD supplied through the driving voltage line PL.

The driving thin-film transistor T1 is connected to the driving voltage line PL and the storage capacitor Cst, and may control a driving current flowing through the organic light-emitting diode OLED from the driving voltage line PL according to the voltage stored in the storage capacitor Cst. The organic light-emitting diode OLED may emit light having a desired brightness (e.g., a predetermined or preset brightness) according to the driving current. The opposite electrode (e.g. a cathode) of the organic light-emitting diode OLED may receive the common voltage ELVSS.

Although FIG. 7A shows that the pixel circuit PC includes two thin-film transistors and one storage capacitor, the present disclosure is not limited thereto. The number of thin-film transistors and the number of storage capacitors may be variously modified depending on the design of the pixel circuit PC.

Referring to FIG. 7B, the pixel circuit PC may include a plurality of thin-film transistors, and a storage capacitor Cst. The thin-film transistors and the storage capacitor Cst may be connected to signal lines, or in other words, the scan line SL, a previous scan line SIL, the emission control line EL, and the data line DL, an initialization voltage line VL, and the driving voltage line PL.

Although FIG. 7B shows that each pixel P is connected to the signal lines, or in other words, the scan line SL, the previous scan line SIL, the emission control line EL, and the data line DL, the initialization voltage line VL, and the driving voltage line PL, the present disclosure is not limited thereto. In another embodiment, at least one of the signal lines (e.g., the scan line SL, the previous scan line SIL, the emission control line EL, and/or the data line DL), the initialization voltage line VL, and/or the driving voltage line PL may be shared by neighboring pixels (e.g., shared by adjacent pixels).

The plurality of thin-film transistors may include a driving thin-film transistor T1, a switching thin-film transistor T2, a compensation thin-film transistor T3, a first initialization thin-film transistor T4, an operation control thin-film transistor T5, an emission control thin-film transistor T6, and a second initialization thin-film transistor T7.

The signal lines include the scan line SL, the previous scan line SIL, the emission control line EL, and the data line DL. The scan line SL transfers a scan signal Sn to the switching thin-film transistor T2 and the compensation thin-film transistor T3. The previous scan line SIL transfers a previous scan signal Sn−1 to the first initialization thin-film transistor T4 and the second initialization thin-film transistor T7. The emission control line EL transfers an emission control signal En to the operation control thin-film transistor T5 and the emission control thin-film transistor T6. The data line DL crosses the scan line SL, and transfers a data signal Dm. The driving voltage line PL transfers the driving voltage ELVDD to the driving thin-film transistor T1, and the initialization voltage line VL transfers an initialization voltage Vint that initializes the driving thin-film transistor T1 and the pixel electrode of the organic light-emitting diode OLED.

A driving gate electrode G1 of the driving thin-film transistor T1 is connected to the first storage capacitor plate CE1 of the storage capacitor Cst. A driving source electrode S1 of the driving thin-film transistor T1 is connected to the driving voltage line PL through the operation control thin-film transistor T5. A driving drain electrode D1 of the driving thin-film transistor T1 is electrically connected to the pixel electrode of the organic light-emitting diode OLED through the emission control thin-film transistor T6. The driving thin-film transistor T1 receives the data signal Dm, and supplies a driving current $I_{OLED}$ to the organic light-emitting diode OLED according to a switching operation of the switching thin-film transistor T2.

A switching gate electrode G2 of the switching thin-film transistor T2 is connected to the scan line SL, and a switching source electrode S2 of the switching thin-film transistor T2 is connected to the data line DL. A switching drain electrode D2 of the switching thin-film transistor T2 is connected to the driving source electrode S1 of the driving thin-film transistor T1, and to the driving voltage line PL through the operation control thin-film transistor T5. The switching thin-film transistor T2 is turned on according to the scan signal Sn transferred through the scan line SL, and performs a switching operation to transfer the data signal Dm transferred through the data line DL to the driving source electrode S1 of the driving thin-film transistor T1.

A compensation gate electrode G3 of the compensation thin-film transistor T3 is connected to the scan line SL. A compensation source electrode S3 of the compensation thin-film transistor T3 is connected to the driving drain electrode D1 of the driving thin-film transistor T1, and to the pixel electrode of the organic light-emitting diode OLED through the emission control thin-film transistor T6. A compensation drain electrode D3 of the compensation thin-film transistor T3 is connected to the first storage capacitor plate CE1 of the storage capacitor Cst, a first initialization drain electrode D4 of the first initialization thin-film transistor T4, and the driving gate electrode G1 of the driving thin-film transistor T1. The compensation thin-film transistor T3 is turned on according to the scan signal Sn transferred through the scan line SL, and diode-connects the driving thin-film transistor T1 by electrically connecting the driving gate electrode G1 to the driving drain electrode D1 of the driving thin-film transistor T1.

A first initialization gate electrode G4 of the first initialization thin-film transistor T4 is connected to the previous scan line SIL. A first initialization source electrode S4 of the first initialization thin-film transistor T4 is connected to a second initialization drain electrode D7 of the second initialization thin-film transistor T7, and to the initialization voltage line VL. The first initialization drain electrode D4 of the first initialization thin-film transistor T4 is connected to the first storage capacitor plate CE1 of the storage capacitor Cst, the compensation drain electrode D3 of the compensation thin-film transistor T3, and the driving gate electrode G1 of the driving thin-film transistor T1. The first initialization thin-film transistor T4 is turned on according to the previous scan signal Sn−1 transferred through the previous scan line SIL, and performs an initialization operation of initializing the voltage of the driving gate electrode G1 of the driving thin-film transistor T1 by transferring the initialization voltage Vint to the driving gate electrode G1 of the driving thin-film transistor T1.

An operation control gate electrode G5 of the operation control thin-film transistor T5 is connected to the emission control line EL, and an operation control source electrode S5 of the operation control thin-film transistor T5 is connected to the driving voltage line PL. An operation control drain electrode D5 of the operation control thin-film transistor T5 is connected to the driving source electrode S1 of the driving thin-film transistor T1, and to the switching drain electrode D2 of the switching thin-film transistor T2.

An emission control gate electrode G6 of the emission control thin-film transistor T6 is connected to the emission control line EL. An emission control source electrode S6 of the emission control thin-film transistor T6 is connected to the driving drain electrode D1 of the driving thin-film transistor T1, and to the compensation source electrode S3 of the compensation thin-film transistor T3. An emission control drain electrode D6 of the emission control thin-film transistor T6 is electrically connected to a second initialization source electrode S7 of the second initialization thin-film transistor T7, and to the pixel electrode of the organic light-emitting diode OLED.

The operation control thin-film transistor T5 and the emission control thin-film transistor T6 are concurrently (e.g., simultaneously) turned on according to the emission control signal En transferred through the emission control line EL. When the operation control thin-film transistor T5 and the emission control thin-film transistor T6 are turned on, the driving voltage ELVDD is transferred to the organic light-emitting diode OLED, and the driving current $I_{OLED}$ flows through the organic light-emitting diode OLED.

A second initialization gate electrode G7 of the second initialization thin-film transistor T7 is connected to the previous scan line SIL. The second initialization source electrode S7 of the second initialization thin-film transistor T7 is connected to the emission control drain electrode D6 of the emission control thin-film transistor T6, and to the pixel electrode of the organic light-emitting diode OLED. The second initialization drain electrode D7 of the second initialization thin-film transistor T7 is connected to the first initialization source electrode S4 of the first initialization thin-film transistor T4, and to the initialization voltage line VL. The second initialization thin-film transistor T7 is turned on according to the previous scan signal Sn−1 transferred through the previous scan line SIL to initialize the pixel electrode of the organic light-emitting diode OLED.

Although FIG. 7B shows a case where the first initialization thin-film transistor T4 and the second initialization thin-film transistor T7 are connected to the previous scan line SIL, the present disclosure is not limited thereto. For example, in another embodiment, the first initialization thin-film transistor T4 may be connected to the previous scan line SIL and driven according to the previous scan signal Sn−1, and the second initialization thin-film transistor T7 may be connected to a separate signal line (e.g. a next scan line) and driven according to a signal transferred through the separate signal line (e.g., the next scan line).

The second storage capacitor plate CE2 of the storage capacitor Cst is connected to the driving voltage line PL, and the opposite electrode of the organic light-emitting diode OLED is connected to the common voltage ELVSS. Accordingly, the organic light-emitting diode OLED may display an image by receiving the driving current $I_{OLED}$ from the driving thin-film transistor T1 and emitting light.

Although FIG. 7B shows that the compensation thin-film transistor T3 and the first initialization thin-film transistor T4 each have a dual gate electrode, the present disclosure is not limited thereto, and in some embodiments, at least one (or both) of the compensation thin-film transistor T3 and the first initialization thin-film transistor T4 may include one gate electrode.

The pixel circuit PC of the pixel P shown in FIGS. 7A and 7B is applicable to the auxiliary pixel circuit PC' of the dummy pixel Pd. In other words, the auxiliary pixel circuit PC' of the dummy pixel Pd may have the same or substantially the same circuit structure as that of the pixel circuit PC shown in FIG. 7A or FIG. 7B, and thus, redundant description thereof may not be repeated.

Figure 8:
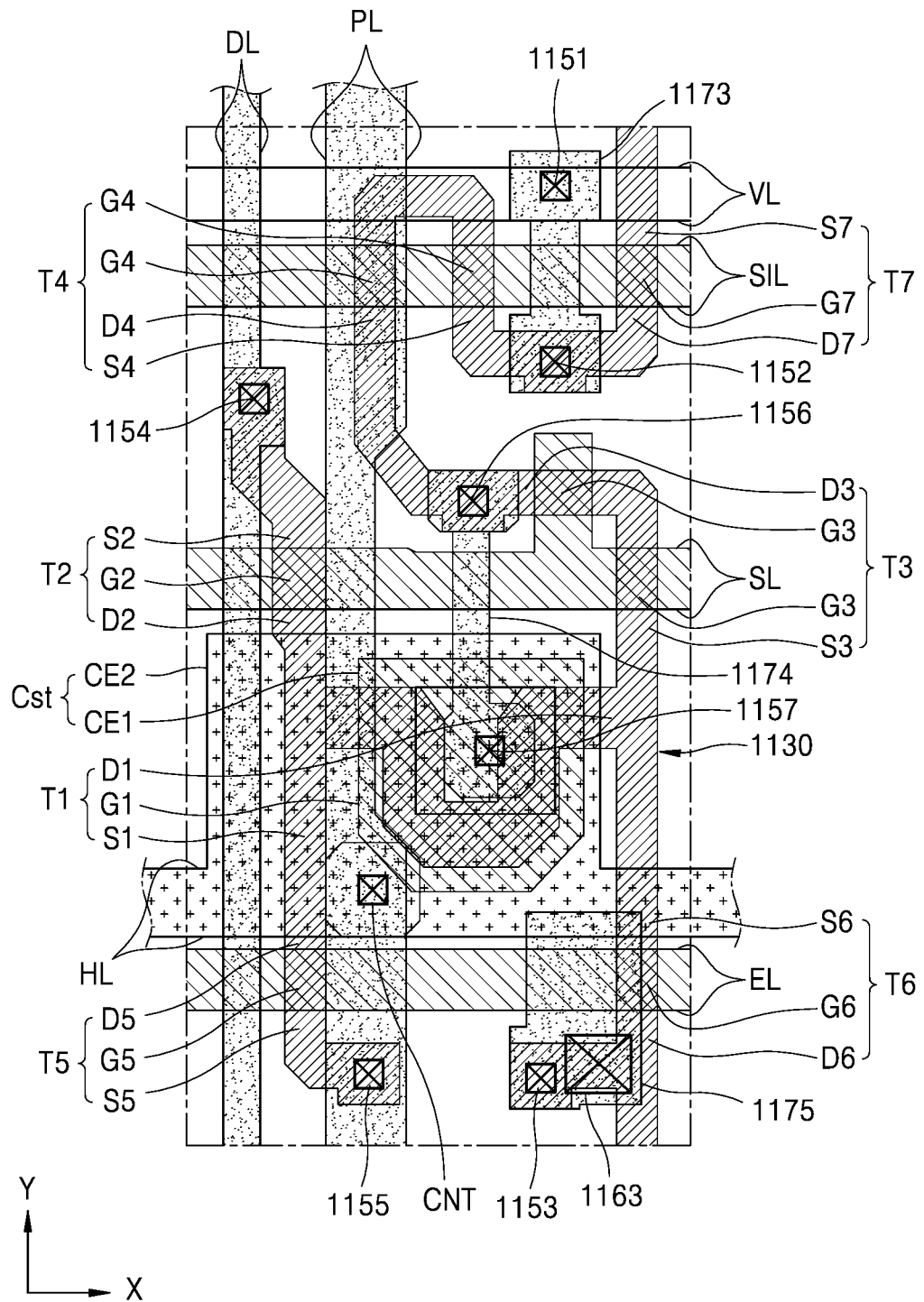
FIG. 8 is a plan arrangement view of a pixel circuit according to an embodiment.

FIG. 8 is a plan arrangement view of a pixel circuit according to an embodiment.

Referring to FIG. 8, the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 are arranged along a semiconductor layer 1130. The semiconductor layer 1130 is arranged over the substrate 100 on which the buffer layer 111, which includes an inorganic insulating material, is formed.

Partial regions of the semiconductor layer 1130 correspond to semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. In other words, the semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 are connected to each other and bent in various suitable shapes.

The semiconductor layer 1130 includes a channel region, a source region, and a drain region, the source region and the drain region being on two opposite sides of the channel region, respectively. The source region and the drain region may be understood as a source electrode and a drain electrode, respectively, of the corresponding thin-film transistor. Hereinafter, the source region and the drain region are denoted by a source electrode and a drain electrode, respectively.

The driving thin-film transistor T1 includes the driving channel electrode G1, the driving source electrode S1, and the driving drain electrode D1. The driving channel electrode G1 may overlap with a driving channel region, and the driving source electrode S1 and the driving drain electrode D1 may be at (e.g., in or on) two opposite sides of the driving channel region, respectively. The driving channel region overlapping with the driving gate electrode G1 may form a long channel length inside (e.g., within) a narrow space by having a bent shape, for example, such as an omega shape. In the case where the length of the driving channel region is long, a driving range of a gate voltage is widened, and a grayscale (e.g., a gray level) of light emitted from the organic light-emitting diode OLED may be more elaborately controlled, and thus, display quality may be improved.

The switching thin-film transistor T2 includes the switching gate electrode G2, the switching source electrode S2, and the switching drain electrode D2. The switching gate electrode G2 may overlap with a switching channel region, and the switching source electrode S2 and the switching drain electrode D2 may be at (e.g., in or on) two opposite sides of the switching channel region, respectively. The switching drain electrode D2 may be connected to the driving source electrode S1.

The compensation thin-film transistor T3 may be a dual thin-film transistor, and may include compensation gate electrodes G3, the compensation source electrode S3, and the compensation drain electrode D3. The compensation gate electrodes G3 may overlap with two compensation channel regions, and the compensation source electrode S3 and the compensation drain electrode D3 may be at (e.g., in or on) two opposite sides, respectively, of the compensation channel regions. The compensation thin-film transistor T3 may be connected to the gate electrode G1 of the driving thin-film transistor T1 through a node connection line 1174 described in more detail below.

The first initialization thin-film transistor T4 may be a dual thin-film transistor, and may include first initialization gate electrodes G4, the first initialization source electrode S4, and the first initialization drain electrode D4. The first initialization gate electrodes G4 may overlap with two first initialization channel regions, and the first initialization source electrode S4 and the first initialization drain electrode D4 may be at (e.g., in or on) two opposite sides, respectively, of the first initialization channel regions.

The operation control thin-film transistor T5 includes the operation control gate electrode G5, the operation control source electrode S5, and the operation control drain electrode D5. The operation control gate electrode G5 may overlap with an operation control channel region, and the operation control source electrode S5 and an operation control drain electrode D5 may be at (e.g., in or on) two opposite sides of the operation control channel region, respectively. The operation control drain electrode D5 may be connected to the driving source electrode S1.

The emission control thin-film transistor T6 may include the emission control gate electrode G6, the emission control source electrode S6, and the emission control drain electrode D6. The emission control gate electrode G6 may overlap with an emission control channel region, and the emission control source electrode S6 and the emission control drain electrode D6 may be at (e.g., in or on) two opposite sides of the emission control channel region, respectively. The emission control source electrode S6 may be connected to the driving drain electrode D1.

The second initialization thin-film transistor T7 may include the second initialization gate electrode G7, the second initialization source electrode S7, and the second initialization drain electrode D7. The second initialization gate electrode G7 may overlap with a second initialization channel region, and the second initialization source electrode S7 and the second initialization drain electrode D7 may be at (e.g., in or on) two opposite sides of the second initialization channel region, respectively.

The above-described thin-film transistors may be connected to the signal lines, or in other words, the scan line SL, the previous scan line SIL, the emission control line EL, and the data line DL, the initialization voltage line VL, and the driving voltage line PL.

The scan line SL, the previous scan line SIL, the emission control line EL, and the driving gate electrode G1 may be arranged over the semiconductor layer 1130 with an insulating layer(s) therebetween.

The scan line SL may extend in the first direction. Regions of the scan line SL may correspond to the switching and compensation gate electrodes G2 and G3. As an example, regions of the scan line SL that overlap with the channel regions of the switching thin-film transistor T2 and the compensation thin-film transistor T3 may be the switching and compensation gate electrodes G2 and G3, respectively.

The previous scan line SIL may extend in the first direction, and may correspond to the first and second initialization gate electrodes G4 and G7, respectively. As an example, regions of the previous scan line SIL that overlap with the channel regions of the first and second initialization thin-film transistors T4 and T7 may be the first and second initialization gate electrodes G4 and G7, respectively.

The emission control line EL may extend in the first direction. Regions of the emission control line EL may correspond to the operation control and emission control gate electrodes G5 and G6, respectively. As an example, regions of the emission control line EL that overlap with the channel regions of the operation control and emission control thin-film transistors T5 and T6 may be the operation and emission control gate electrodes G5 and G6, respectively.

The driving gate electrode G1 is a floating electrode, and may be connected to the node connection line 1174 and the compensation thin-film transistor T3.

An electrode voltage line HL may be arranged over the scan line SL, the previous scan line SIL, the emission control line EL, and the driving gate electrode G1 with an insulating layer(s) therebetween.

The electrode voltage line HL may extend in the first direction to cross the data line DL and the driving voltage line PL. A portion of the electrode voltage line HL may cover at least a portion of the driving gate electrode G1, and may constitute the storage capacitor Cst in cooperation with the driving gate electrode G1. As an example, the driving gate electrode G1 serves as the first storage capacitor plate CE1 of the storage capacitor Cst, and a portion of the electrode voltage line HL may serve as the second storage capacitor plate CE2 of the storage capacitor Cst.

The second storage capacitor plate CE2 of the storage capacitor Cst is electrically connected to the driving voltage line PL. For example, the electrode voltage line HL may be connected to the driving voltage line PL arranged over the electrode voltage line HL through a contact hole CNT. Accordingly, the electrode voltage line HL may have the same or substantially the same voltage level (e.g., a constant or substantially constant voltage) as that of the driving voltage line PL. As an example, the electrode voltage line HL may have a constant or substantially constant voltage of about +5V. The electrode voltage line HL may be understood as a transverse driving voltage line.

The driving voltage line PL extends in the second direction, and the electrode voltage line HL that is electrically connected to the driving voltage line PL extends in the first direction crossing the second direction, and thus, the plurality of driving voltage lines PL and electrode voltage lines HL may constitute (e.g., may form) a mesh structure at (e.g., in or on) the display area DA.

In the present embodiment, the electrode voltage line HL may be arranged at (e.g., in or on) a layer that is different from that of the driving voltage line PL, and a resistance (e.g., a predetermined or specific resistance) of the electrode voltage line HL may be greater than a resistance (e.g., a predetermined or specific resistance) of the driving voltage line PL.

The data line DL, the driving voltage line PL, an initialization connection line 1173, and the node connection line 1174 may be arranged over the electrode voltage line HL with an insulating layer(s) therebetween.

The data line DL may extend in the second direction, and may be connected to the switching source electrode S2 of the switching thin-film transistor T2 through a contact hole 1154. A portion of the data line DL may be understood as the switching source electrode S2.

The driving voltage line PL extends in the second direction, and is connected to the electrode voltage line HL through the contact hole CNT as described above. In addition, the driving voltage line PL may be connected to the operation control thin-film transistor T5 through a contact hole 1155. The driving voltage line PL may be connected to the operation control source electrode S5 through the contact hole 1155.

One end of the initialization line 1173 is connected to the first and second initialization thin-film transistors T4 and T7 through a contact hole 1152, and the other end (e.g., an opposite end) of the initialization line 1173 may be connected to the initialization voltage line VL through a contact hole 1151.

One end of the node connection line 1174 may be connected to the compensation drain electrode D3 through a contact hole 1156, and the other end (e.g., an opposite end) of the node connection line 1174 may be connected to the driving gate electrode G1 through a contact hole 1157.

The initialization voltage line VL may be arranged over the data line DL, the driving voltage line PL, the initialization connection line 1173, and the node connection line 1174.

The initialization voltage line VL extends in the first direction. The initialization voltage line VL may be connected to the first and second initialization thin-film transistors T4 and T7 through the initialization connection line 1173. The initialization voltage line VL may have a constant or substantially constant voltage (e.g. −2V, or the like).

The initialization voltage line VL may be arranged at (e.g., in or on) the same layer as that of the second storage capacitor plate CE2, or in other words, as that of the electrode voltage line HL. The initialization voltage line VL may include the same or substantially the same material as that of the second storage capacitor plate CE2. The pixel electrode of the organic light-emitting diode OLED may be connected to the emission control thin-film transistor T6 at (e.g., in or on) the display area DA. The pixel electrode may be connected to a connection metal 1175 through a contact hole 1163, and the connection metal 1175 may be connected to the emission control drain electrode D6 through a contact hole 1153.

Figure 9:
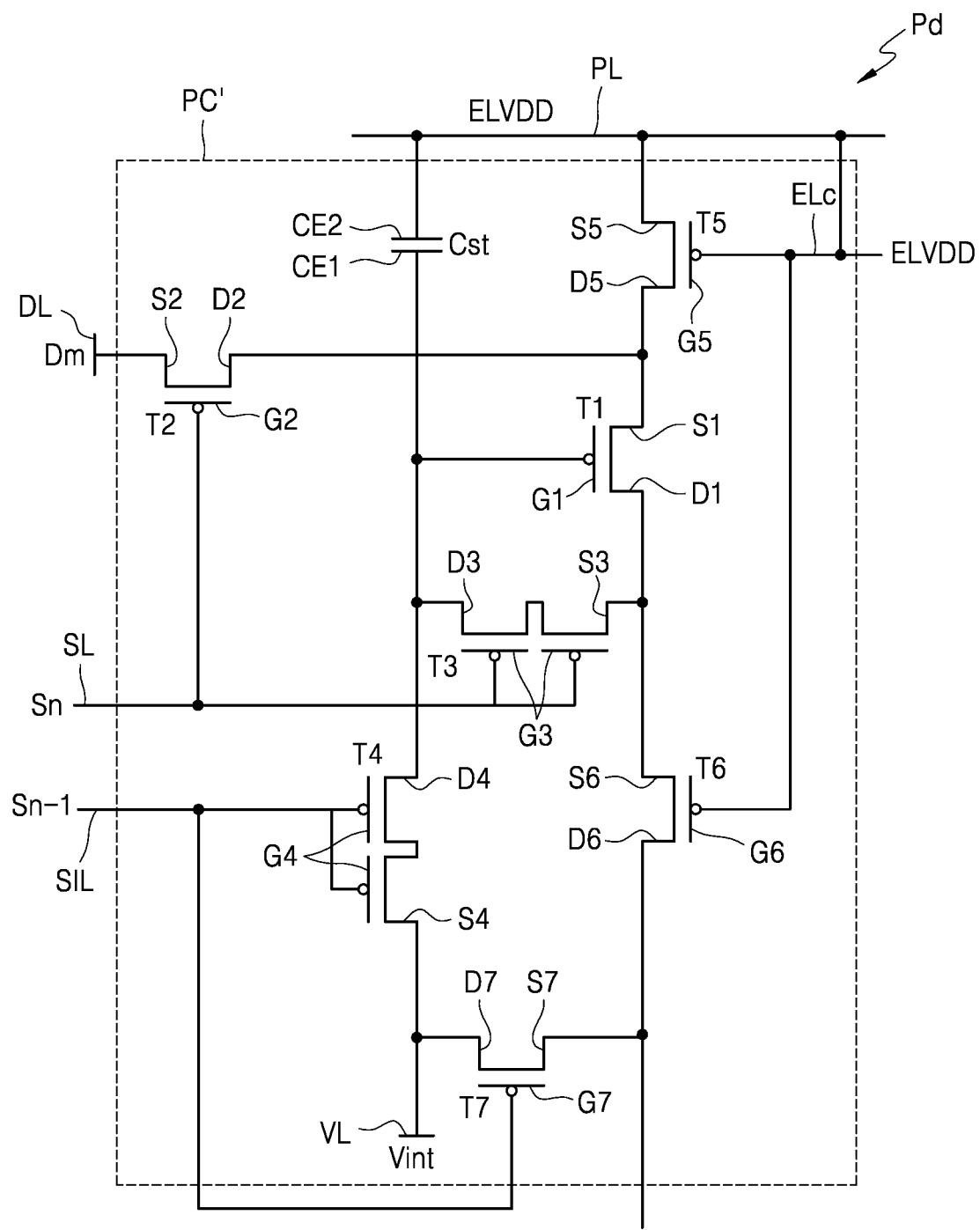
FIG. 9 is an equivalent circuit diagrams of an auxiliary pixel circuit according to an embodiment.
Figure 10:
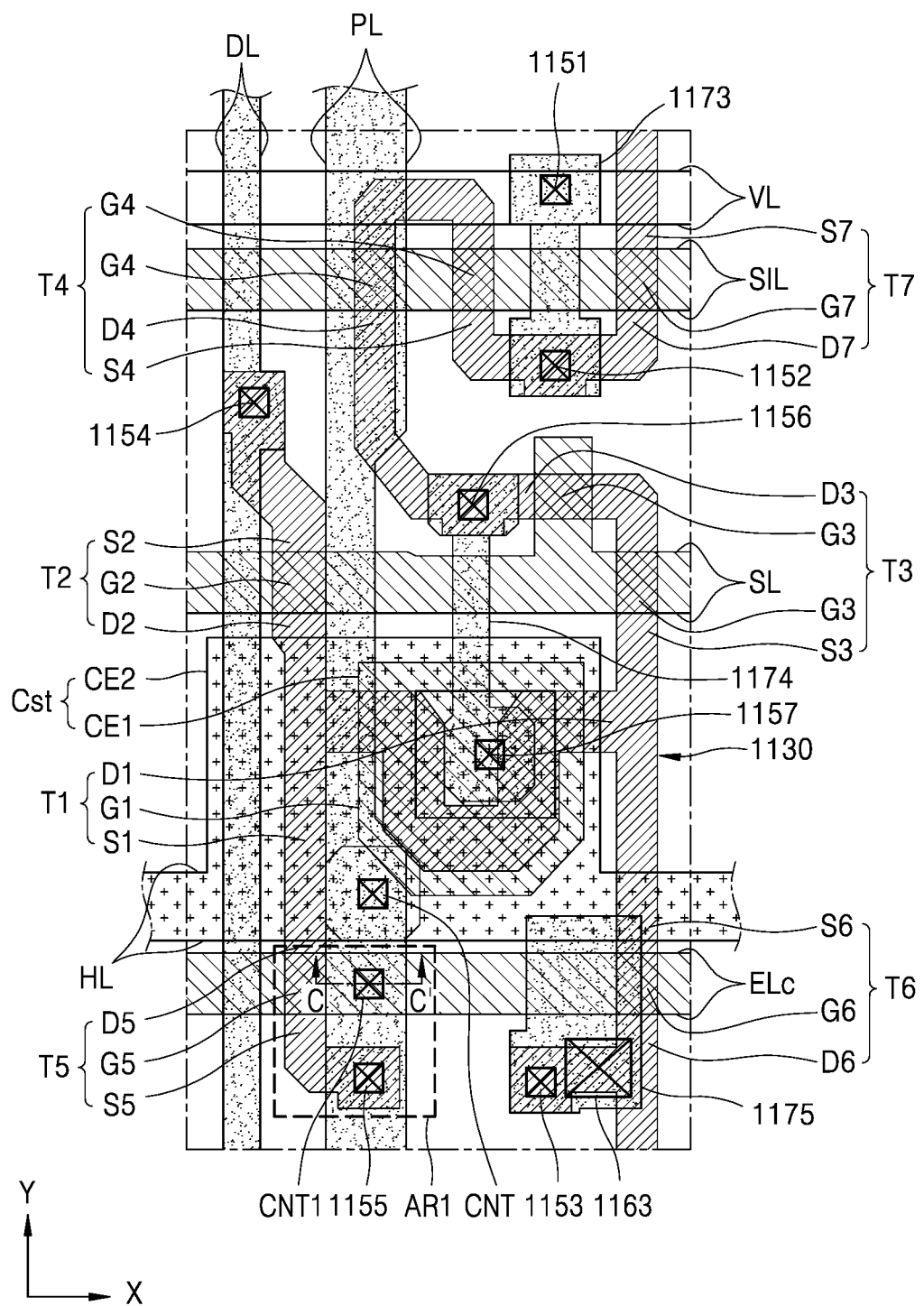
FIG. 10 is a plan view of the auxiliary pixel circuit shown in FIG. 9 according to an embodiment.
Figure 11:
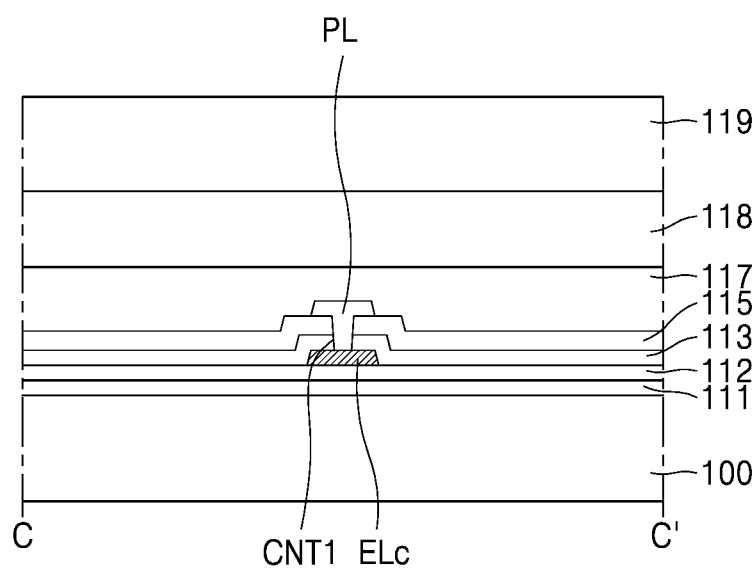
FIG. 11 is a cross-sectional view taken along the line C-C' of FIG. 10 according to an embodiment.

FIG. 9 is an equivalent circuit diagram of an auxiliary pixel circuit according to an embodiment. FIG. 10 is a plan view of an auxiliary pixel circuit shown in FIG. 9. FIG. 11 is a cross-sectional view taken along the line C-C' of FIG. 10.

Referring to FIGS. 9 and 10, an auxiliary pixel circuit PC' may be nearly the same as (e.g., may be substantially the same as or similar to) the pixel circuit PC described with reference to FIG. 8. Accordingly the same reference symbols as those of the pixel circuit PC shown in FIG. 8 are used to denote the same or substantially the same elements in FIGS. 9 and 10, and redundant description thereof may not be repeated.

The third emission control line ELc and the driving voltage line PL may be arranged at (e.g., in or on) different layers from each other. As an example, the third emission control line ELc may be arranged on the first gate insulating layer 112, the second gate insulating layer 113, and/or the interlayer insulating layer 115, and the driving voltage line PL may be arranged on the interlayer insulating layer 115, the first planarization layer 117, the second planarization layer 118, or the pixel-defining layer 119. In this case, because the planarization layer includes a plurality of planarization layers, the driving voltage line PL may be arranged between the plurality of planarization layers. Hereinafter, for convenience of description, a case where the third emission control line ELc is arranged on the first gate insulating layer 112, and the driving voltage line PL is arranged on the interlayer insulating layer 115 is mainly described in more detail.

The third emission control line ELc of the auxiliary pixel circuit PC' may be connected to the driving voltage line PL through a contact hole CNT1. In an embodiment, as shown in FIG. 11, the third emission control line ELc may be arranged on the first gate insulating layer 112, and the driving voltage line PL may be arranged on the interlayer insulating layer 115. In this case, the contact hole CNT1 may be formed in (e.g., may be formed to penetrate) the interlayer insulating layer 115 and the second gate insulating layer 113 to connect the driving voltage line PL to the third emission control line ELc.

In the case where the third emission control line ELc and the driving voltage line PL are formed as described above, the driving voltage ELVDD may be applied through the third emission control line ELc. In this case, because the operation control thin-film transistor T5 that is connected to the third emission control line ELc is turned off, there may be no influence of a parasitic capacitance occurring due to the arrangement of the third emission control line ELc and another wiring. In this case, the operation control thin-film transistor T5 may be P-type transistor.

In other words, in the present example, the operation control thin-film transistor T5 may always maintain or substantially maintain an off-state to prevent (e.g., to stop) the operation of the auxiliary pixel circuit PC'. An abnormal signal may be prevented from being transferred to the pixel circuit PC through the data line DL, the scan line SL, and/or the like connecting the auxiliary pixel circuit PC' to the pixel circuit PC.

In a case where the auxiliary pixel circuit PC' has the same or substantially the same pixel circuit structure as that of the pixel circuit PC shown in FIGS. 7B and 8, an unexpected signal may occur to the third emission control line ELc. As an example, when a signal, such as a voltage and/or the like, is applied to the third emission control line ELc due to a wiring that is different from the third emission control line ELc, for example, such as an external electrostatic discharge and/or the like, the operation control thin-film transistor T5 may be turned on. Due to the operation of the operation control thin-film transistor T5, an unexpected signal from outside the auxiliary pixel circuit PC' may be transferred to the pixel circuit PC outside the first non-display area NDA1 according to the operation of other thin-film transistors. In this case, the signal may be mixed with a signal that is actually applied to the pixel circuit PC to cause a malfunction of the pixel circuit PC. Thus, the pixel circuit PC may or may not emit light according to an actually applied signal, may oppositely operate, or may emit light of a color different from a color corresponding to the actually applied signal.

Thus, according to an embodiment of the present disclosure, the operation control thin-film transistor T5 of the auxiliary pixel circuit PC' may always be turned off.

Accordingly, in the case where the display apparatus 1 includes the first non-display area NDA1, a signal may be prevented or substantially prevented from varying in each driving circuit, even though the signal may be transferred to the pixel P through the dummy pixel Pd arranged at (e.g., in or on) the first non-display area NDA1.

In addition, the display apparatus 1 may prevent or substantially prevent a malfunctioning signal in advance, the malfunctioning signal occurring from the third emission control line ELc due to the arrangement of the third emission control line ELc and another line (or wiring).

Figure 12A:
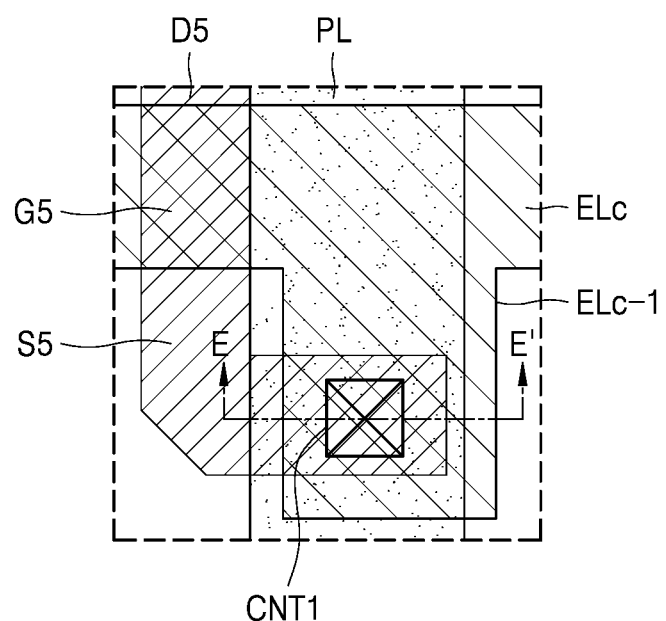
FIG. 12A is a plan arrangement view of a portion of an auxiliary pixel circuit according to another embodiment.
Figure 12B:
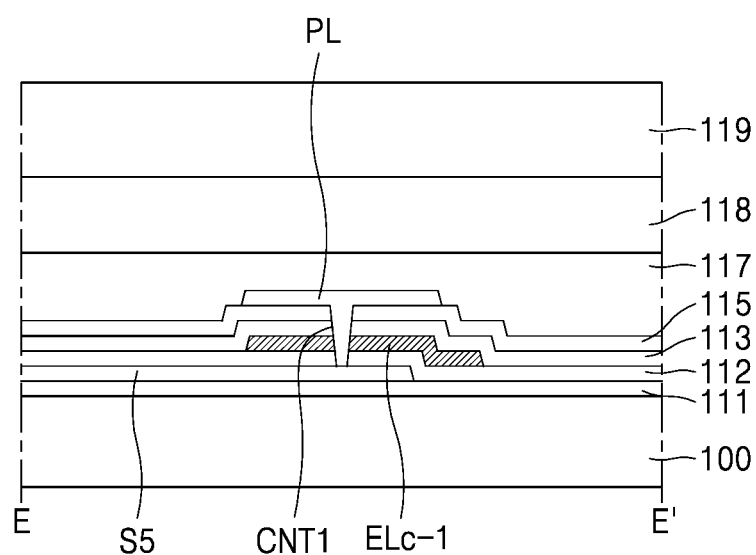
FIG. 12B is a cross-sectional view taken along the line E-E' of FIG. 12A according to an embodiment.

FIG. 12A is a plan arrangement view of a portion of an auxiliary pixel circuit according to another embodiment. FIG. 12B is a cross-sectional view taken along the line E-E' of FIG. 12A.

Referring to FIGS. 12A and 12B, the driving voltage line PL and the third emission control line ELc of the auxiliary pixel circuit PC' may be connected to each other at (e.g., in or on) a portion of the pixel circuit PC shown in FIG. 8 where the contact hole 1155 is arranged.

In this case, the operation control source electrode S5 of the operation control thin-film transistor T5 of the auxiliary pixel circuit PC' may not overlap with the driving voltage line PL, and the operation control source electrode S5 of the operation control thin-film transistor T5 may be electrically connected to the driving voltage line PL. In another embodiment, the operation control source electrode S5 of the operation control thin-film transistor T5 of the auxiliary pixel circuit PC' may at least partially overlap with the driving voltage line PL, but may not overlap with a protrusion ELc-1 described in more detail below. In another embodiment, the operation control source electrode S5 of the operation control thin-film transistor T5 of the auxiliary pixel circuit PC', the driving voltage line PL, and the protrusion ELc-1 described in more detail below may at least partially overlap with one another, for example, as shown in FIGS. 12A and 12B. In this case, the operation control source electrode S5 of the operation control thin-film transistor T5 of the auxiliary pixel circuit PC', the driving voltage line PL, and the protrusion ELc-1 may be arranged at (e.g., in or on) variously layers to be spaced apart from one another. Hereinafter, for convenience of description, the case where the operation control source electrode S5 of the operation control thin-film transistor T5 of the auxiliary pixel circuit PC', the driving voltage line PL, and the protrusion ELc-1 described in more detail below at least partially overlap one another is mainly described in more detail.

The operation control source electrode S5 of the operation control thin-film transistor T5 of the auxiliary pixel circuit PC' may be arranged on the buffer layer 111. The protrusion ELc-1 may be arranged on the first gate insulating layer 112. The driving voltage line PL may be arranged on the interlayer insulating layer 115. The operation control source electrode S5 of the operation control thin-film transistor T5 of the auxiliary pixel circuit PC' may be spaced apart from the protrusion ELc-1 by the first gate insulating layer 112. The protrusion ELc-1 may be spaced apart from the driving voltage line PL by the second gate insulating layer 113 and the interlayer insulating layer 115. The protrusion ELc-1, the driving voltage line PL, and the operation control source electrode S5 of the operation control thin-film transistor T5 may be connected to each other through the contact hole CNT1.

The third emission control line ELc may include the protrusion ELc-1. The protrusion ELc-1 may protrude from an outer surface of the third emission control line ELc to form an angle (e.g., a predetermined or a preset angle) from a lengthwise direction of the third emission control line ELc. The protrusion ELc-1 may at least partially overlap with the driving voltage line PL and the operation control source electrode S5 of the operation control thin-film transistor T5 in a plan view (e.g., a view from a direction that is perpendicular to or substantially perpendicular to a top surface thereof).

The protrusion ELc-1 may be connected to the driving voltage line PL through the contact hole CNT1. In this case, as shown in FIG. 12B, the contact hole CNT1 may pass (e.g., may penetrate) through respective layers arranged between the protrusion ELc-1 and the operation control source electrode S5 of the operation control thin-film transistor T5. In this case, the contact hole CNT1 may pass through the protrusion ELc–1.

In the case where the driving voltage line PL is connected to the third emission control line ELc, as described above, when the driving voltage ELVDD is applied to the operation control thin-film transistor T5 of the auxiliary pixel circuit PC', the operation control thin-film transistor T5 may be turned off.

Furthermore, in the present embodiment, not only is the operation control thin-film transistor T5 turned off, but the operation control thin-film transistor T5 is also connected to the driving voltage line PL, and thus, transferring of a malfunctioning signal that may occur from the third emission control line ELc to the data line DL may be blocked or substantially blocked.

Accordingly, in the case where the display apparatus 1 includes the first non-display area NDA1, each driving circuit unit may prevent or substantially prevent a signal that is transferred to the pixel P through the dummy pixel Pd arranged at (e.g., in or on) the first non-display area NDA1 from varying.

Figure 13A:
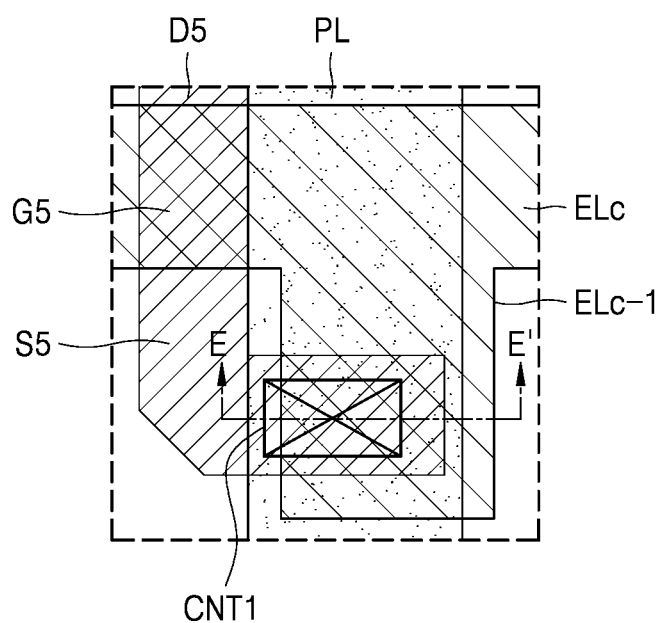
FIG. 13A is a plan arrangement view of a portion of an auxiliary pixel circuit according to another embodiment.
Figure 13B:
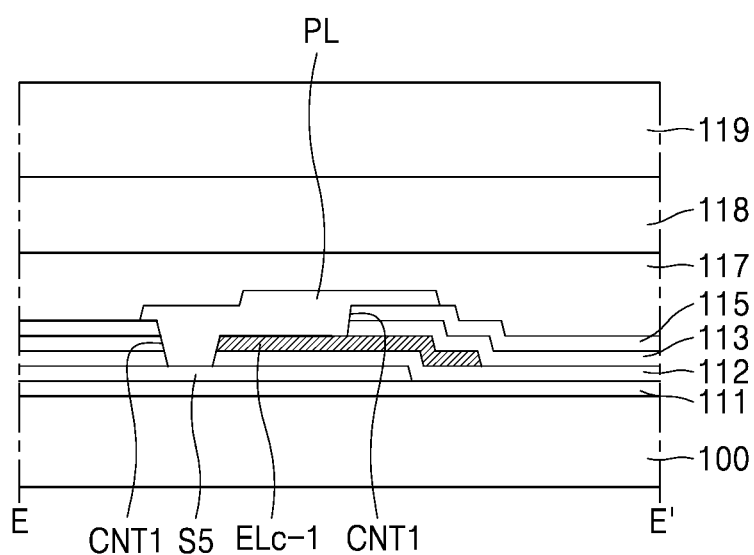
FIG. 13B is a cross-sectional view taken along the line E-E' of FIG. 13A according to an embodiment.

FIG. 13A is a plan arrangement view of a portion of an auxiliary pixel circuit according to another embodiment. FIG. 13B is a cross-sectional view taken along the line E-E' of FIG. 13A.

Referring to FIGS. 13A and 13B, the driving voltage line PL of the auxiliary pixel circuit PC' may be connected to the third emission control line ELc at (e.g., in or on) a portion where the contact hole 1155 of the pixel circuit PC shown in FIG. 8 is arranged.

The operation control source electrode S5 of the operation control thin-film transistor T5 of the auxiliary pixel circuit PC', the driving voltage line PL, and the protrusion ELc–1 described in more detail below may at least partially overlap with one another as shown in FIGS. 13A and 13B. In this case, the operation control source electrode S5 of the operation control thin-film transistor T5 of the auxiliary pixel circuit PC', the driving voltage line PL, and the protrusion ELc–1 may be arranged at (e.g., in or on) variously layers to be spaced apart from one another.

In this case, the operation control source electrode S5 of the operation control thin-film transistor T5 of the auxiliary pixel circuit PC' may be arranged on the buffer layer 111. The protrusion ELc–1 may be arranged on the first gate insulating layer 112. The driving voltage line PL may be arranged on the interlayer insulating layer 115. In this case, the operation control source electrode S5 of the operation control thin-film transistor T5 of the auxiliary pixel circuit PC' may be spaced apart from the protrusion ELc–1 by the first gate insulating layer 112. The protrusion ELc–1 may be spaced apart from the driving voltage line PL by the second gate insulating layer 113 and the interlayer insulating layer 115. The protrusion ELc–1, the operation control source electrode S5 of the operation control thin-film transistor T5, and the driving voltage line PL may be connected to each other through the contact hole CNT1.

The third emission control line ELc may include the protrusion ELc–1. The protrusion ELc–1 may protrude from the outer surface of the third emission control line ELc to form an angle (e.g., a predetermined or a preset angle) from the lengthwise direction of the third emission control line ELc. The protrusion ELc–1 may at least partially overlap with the driving voltage line PL in a plan view.

The operation control source electrode S5 of the operation control thin-film transistor T5 may be partially bent, and the bent portion of the operation control source electrode S5 of the operation control thin-film transistor T5 may be arranged under (e.g., underneath) the driving voltage line PL and the bottom surface of the protrusion ELc–1.

The protrusion ELc–1 may be connected to the driving voltage line PL and the operation control source electrode S5 of the operation control thin-film transistor T5 through the contact hole CNT1. In this case, as shown in FIG. 13B, the contact hole CNT1 may pass through respective layers arranged between the protrusion ELc–1 and the driving voltage line PL, and a layer arranged between the driving voltage line PL and the operation control source electrode S5 of the operation control thin-film transistor T5. In this case, the contact hole CNT1 may be arranged on the top surfaces of the protrusion ELc–1, the driving voltage line PL, and the operation control source electrode S5 of the operation control thin-film transistor T5.

In the case where the driving voltage line PL is connected to the third emission control line ELc, as described above, when the driving voltage ELVDD is applied to the operation control thin-film transistor T5 of the auxiliary pixel circuit PC', the operation control thin-film transistor T5 may be turned off.

Furthermore, in the present embodiment, not only is the operation control thin-film transistor T5 turned off, but the operation control thin-film transistor T5 is also connected to the driving voltage line PL, and thus, transferring of a malfunctioning signal that may occur from the third emission control line ELc to the data line DL may be blocked or substantially blocked.

Accordingly, in the case where the display apparatus 1 includes the first non-display area NDA1, each driving circuit unit may prevent or substantially prevent a signal that is transferred to the pixel P through the dummy pixel Pd arranged at (e.g., in or on) the first non-display area NDA1 from varying.

In addition, the display apparatus 1 may prevent or substantially prevent a malfunctioning signal in advance, the malfunctioning signal occurring from the third emission control line ELc due to the arrangement of the third emission control line ELc and another line (or wiring).

Figure 14:
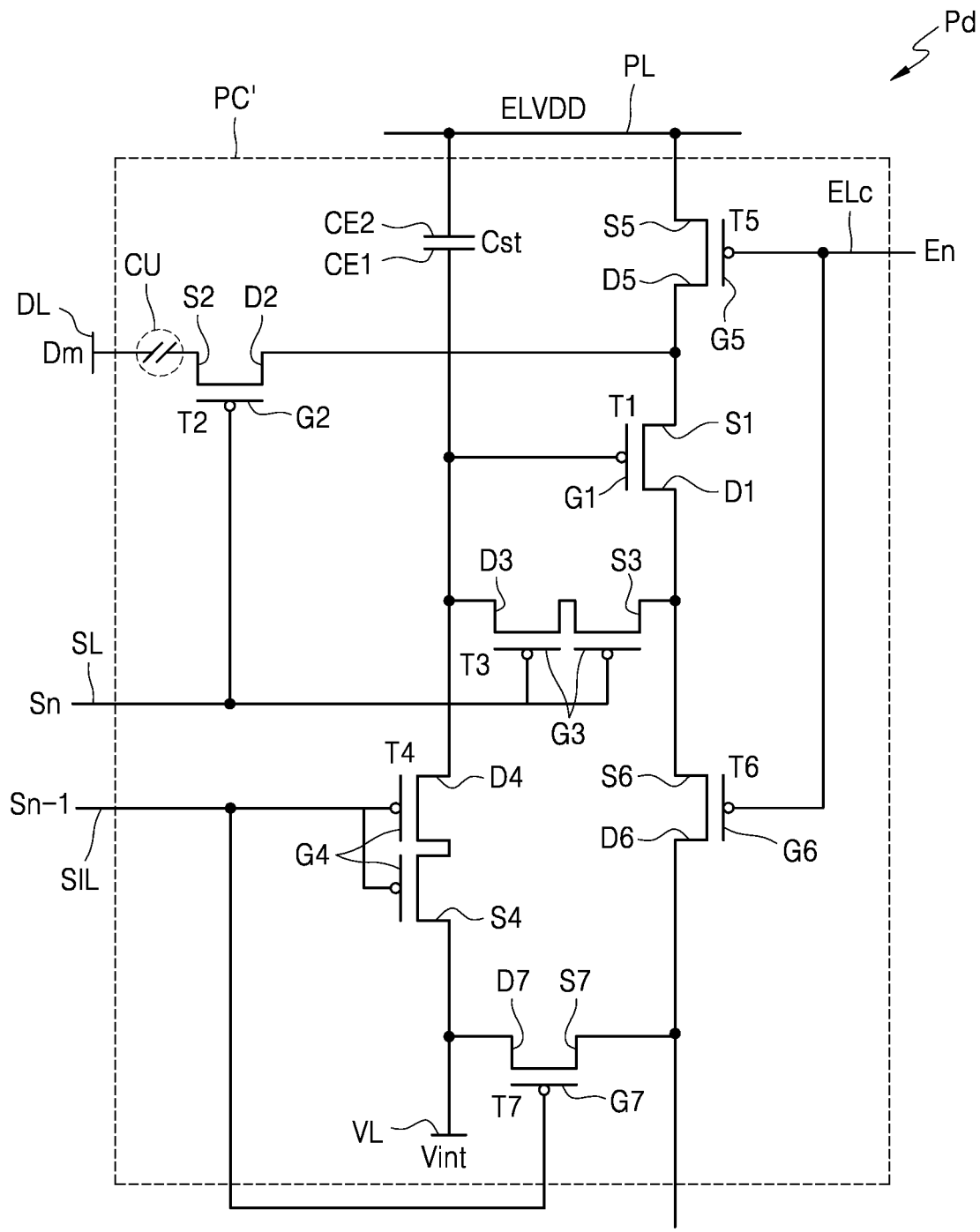
FIG. 14 is an equivalent circuit diagram of an auxiliary pixel circuit according to another embodiment.
Figure 15:
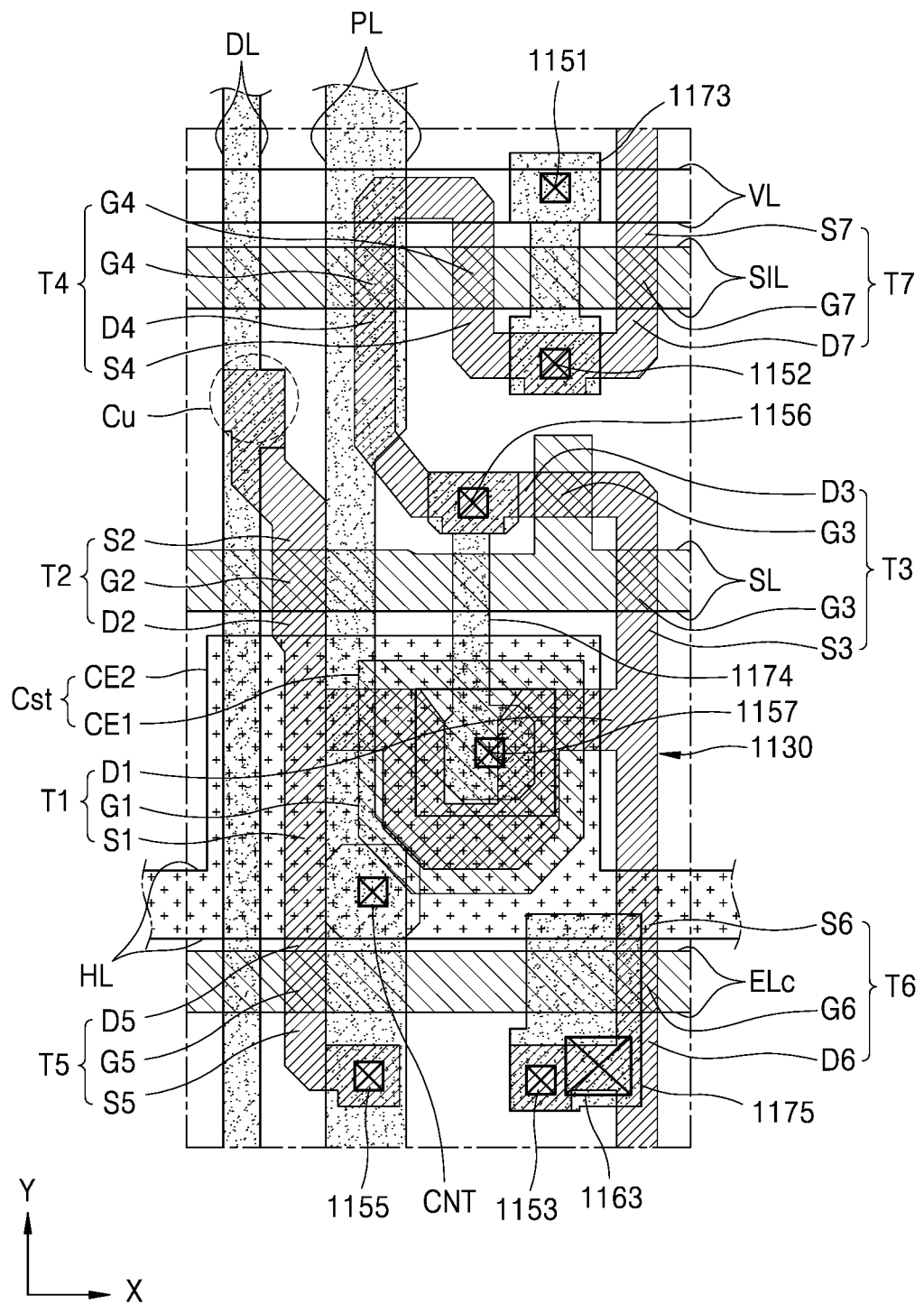
FIG. 15 is a plan arrangement view of the auxiliary pixel circuit shown in FIG. 14 according to an embodiment.

FIG. 14 is an equivalent circuit diagram of an auxiliary pixel circuit according to another embodiment. FIG. 15 is a plan arrangement view of the auxiliary pixel circuit shown in FIG. 14.

Referring to FIGS. 14 and 15, the auxiliary pixel circuit PC' may electrically insulate the data line DL from the switching thin-film transistor T2 (e.g., see CU in FIGS. 14 and 15). In an embodiment, the data line DL may not be connected to the switching source electrode S2 of the switching thin-film transistor T2. In this case, the contact hole 1154 of the pixel circuit PC shown in FIG. 8 may be omitted.

The data line DL may connect some of the plurality of auxiliary pixel circuits PC' to some of the plurality of pixel circuits PC. In other words, the data line DL may pass through the display area DA and the first non-display area NDA1 by extending in the direction in which the long side of the substrate 100 extends (e.g., by extending in the second direction).

In this case, even when a malfunctioning signal occurs from the third emission control line ELc, the malfunctioning signal may not be transmitted to the data line DL.

In more detail, in the case where a signal occurs from the third emission control line ELc, even when each transistor operates, the data line DL may not be connected to the switching thin-film transistor T2 of the auxiliary pixel circuit PC', and thus, the signal may not be transferred to the data line DL according to the operation of the switching thin-film transistor T2. In this case, a signal (e.g., a data signal) transferred through the data line DL may not be disturbed.

Accordingly, in the case where the display apparatus 1 includes the first non-display area NDA1, a signal that is transferred to the pixel P through the dummy pixel Pd arranged at (e.g., in or on) the first non-display area NDA1 may be prevented or substantially prevented from varying in each driving circuit.

In addition, the display apparatus 1 may prevent or substantially prevent a malfunctioning signal in advance, the malfunctioning signal occurring from the third emission control line ELc due to the arrangement of the third emission control line ELc and another line (or wiring).

Figure 16:
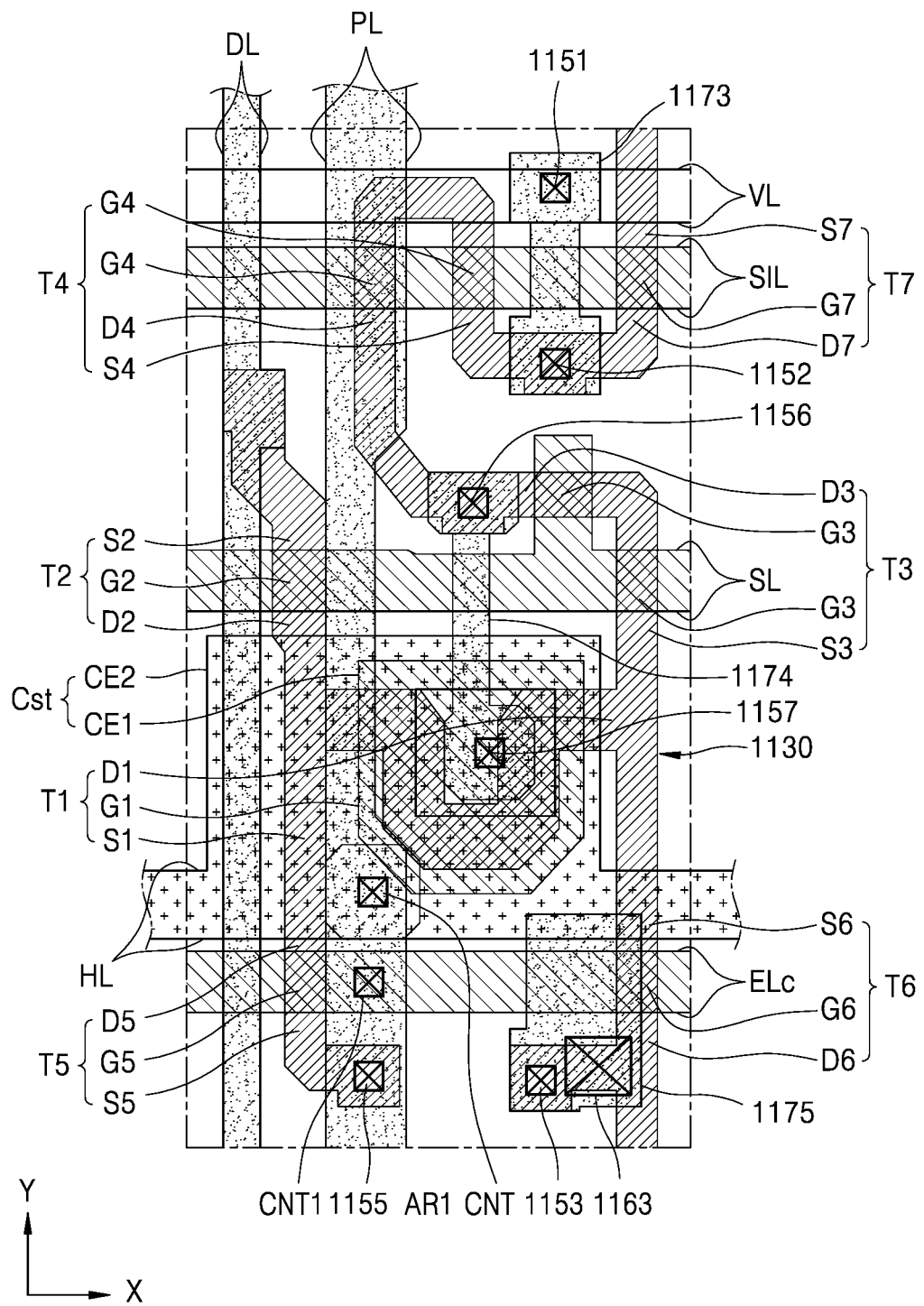
FIG. 16 is a plan arrangement view of an auxiliary pixel circuit according to another embodiment.

FIG. 16 is a plan arrangement view of an auxiliary pixel circuit according to another embodiment.

Referring to FIG. 16, the auxiliary pixel circuit PC' may connect the third emission control line ELc to the driving voltage line PL, like the auxiliary pixel circuit PC' shown in FIG. 10. Further, the switching source electrode S2 of the switching thin-film transistor T2 may be electrically insulated from the data line DL, like the auxiliary pixel circuit PC' shown in FIG. 15.

In this case, the driving voltage ELVDD is applied to the third emission control line ELc, and thus, the operation control thin-film transistor T5 may be turned off. Furthermore, because the switching source electrode S2 is not connected to the data line DL, even if the operation control thin-film transistor T5 operates, a signal that may occur from the dummy pixel Pd may be prevented or substantially prevented from being transferred to the data line DL through the switching source electrode S2.

Accordingly, in the case where the display apparatus 1 includes the first non-display area NDA1, a signal that may be transferred to the pixel P through the dummy pixel Pd arranged at (e.g., in or on) the first non-display area NDA1 may be prevented or substantially prevented from varying in each driving circuit.

In addition, the display apparatus 1 may prevent or substantially prevent a malfunctioning signal in advance, the malfunctioning signal occurring from the third emission control line ELc due to the arrangement of the third emission control line ELc and another line (or wiring).

The present disclosure is not limited thereto. As shown in FIGS. 12A and 12B, the third emission control line ELc may be connected to the driving voltage line PL.

In this case, the driving voltage line PL is not connected to the operation control thin-film transistor T5, and thus, a malfunctioning signal occurring from the third emission control line ELc may not be transferred to the data line DL.

Figure 17:
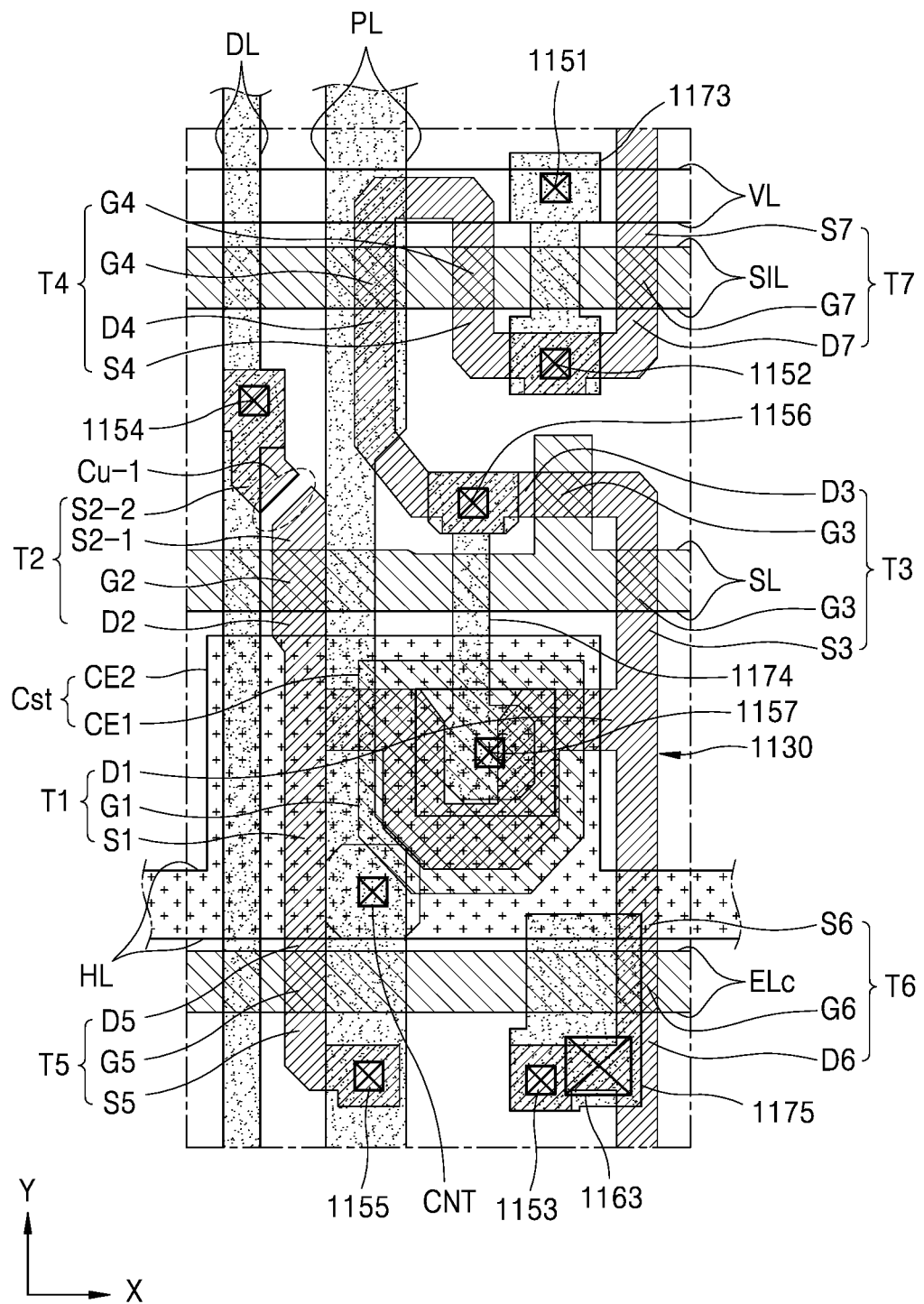
FIG. 17 is a plan arrangement view of an auxiliary pixel circuit according to another embodiment.

FIG. 17 is a plan arrangement view of an auxiliary pixel circuit according to another embodiment.

Referring to FIG. 17, the auxiliary pixel circuits PC' may be similar to the pixel circuit PC shown in FIG. 8. In this case, the switching thin-film transistor T2 may include a plurality of switching source electrodes S2-1 and S2-2 that are spaced apart and electrically insulated from each other (e.g., see CU–1 in FIG. 17). As an example, the switching thin-film transistor T2 may include a first switching source electrode S2-1 and a second switching source electrode S2-2. In this case, the first switching source electrode S2-1 may be connected to the driving thin-film transistor T1, and to the driving voltage line PL through the operation control thin-film transistor T5. The second switching source electrode S2-2 may be spaced apart from the first switching source electrode S2-1, electrically insulated from the first switching source electrode S2-1, and connected to the data line DL through a contact hole 1154.

In this case, as described with reference to FIGS. 14 and 15, a signal that may occur from the third emission control line ELc may be prevented or substantially prevented from being transferred to the data line DL.

Accordingly, in the case where the display apparatus 1 includes the first non-display area NDA1, a signal that may be transferred to the pixel P through the dummy pixel Pd arranged at (e.g., in or on) the first non-display area NDA1 may be prevented or substantially prevented from varying in each driving circuit.

In addition, the display apparatus 1 may prevent or substantially prevent a malfunctioning signal in advance, the malfunctioning signal occurring from the third emission control line ELc due to the arrangement of the third emission control line ELc and another line (or wiring).

Although FIG. 17 shows that the switching source electrode S2 of the switching thin-film transistor T2 has a disconnected shape, the present disclosure is not limited thereto. For example, at least one of the switching drain electrode D2, the driving drain electrode D1, the driving source electrode S1, the operation control drain electrode D5, and/or the operation control source electrode S5 may have a disconnected shape that is the same or substantially the same as (or similar to) the switching source electrodes S2-1 and S2-2 shown in FIG. 17.

Figure 18:
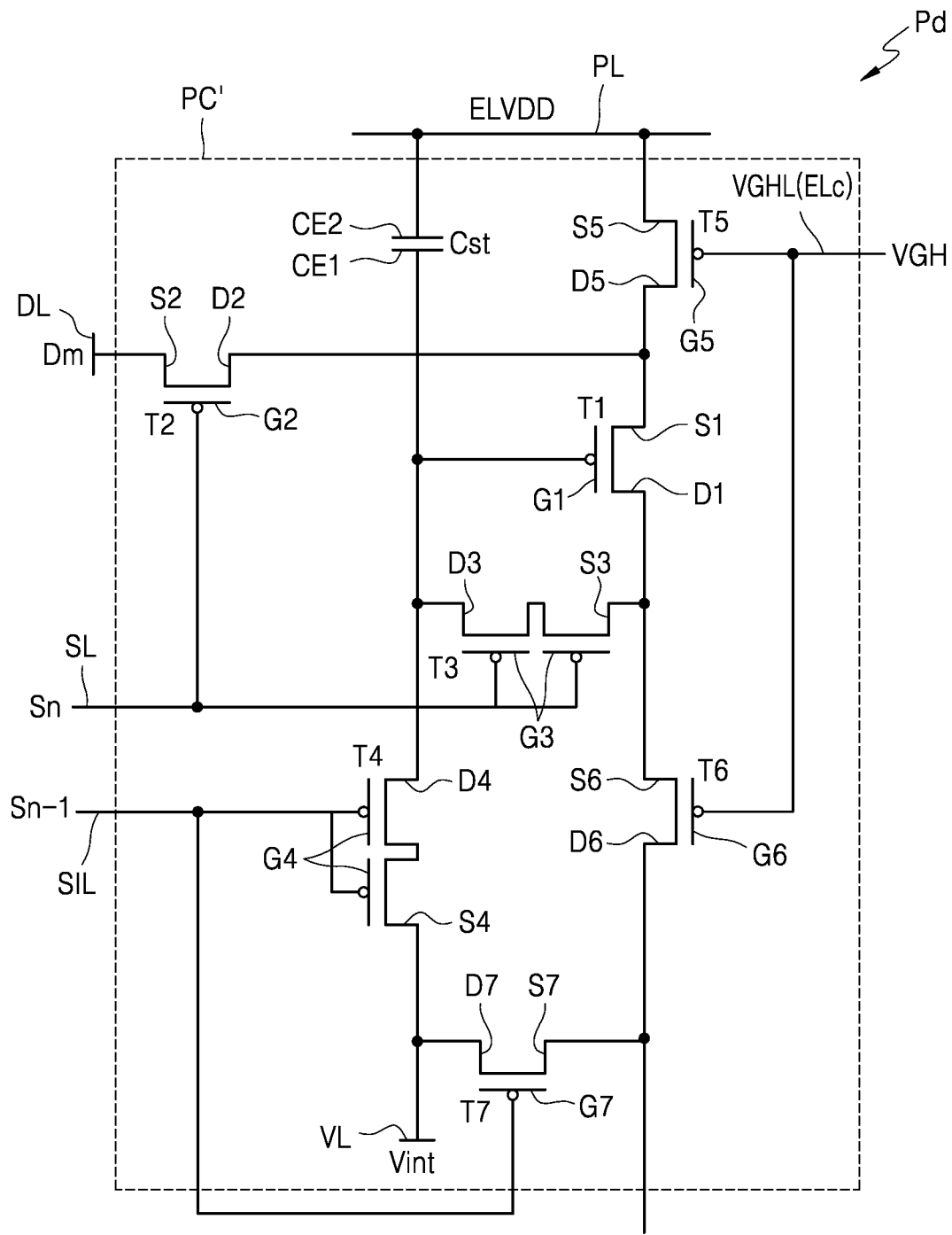
FIG. 18 is an equivalent circuit diagram of an auxiliary pixel circuit according to another embodiment.

FIG. 18 is an equivalent circuit diagram of an auxiliary pixel circuit according to another embodiment.

Referring to FIG. 18, the auxiliary pixel circuits PC' may have the same or substantially the same configuration as that of the pixel circuit PC shown in FIG. 8. In this case, the third emission control line ELc and the driver power line VGHL may be separately formed, and then the third emission control line ELc may be connected to the driver power line VGHL. In other words, the third emission control line ELc and the driver power line VGHL may be arranged at (e.g., in or on) the same layer as each other to be spaced apart from each other, and may be connected to each other through a separate contact hole and/or the like. In another embodiment, the third emission control line ELc and the driver power line VGHL may be arranged at (e.g., in or on) different layers from each other to be spaced apart from each other, and the layers between the third emission control line ELc and the driver power line VGHL may be connected to each other through a separate contact hole. As an example, the driver power line VGHL may be arranged at (e.g., in or on) the same layer as that of the driving voltage line PL shown in FIG. 12B or 13B, and the driver power line VGHL may be connected to the third emission control line ELc. In another embodiment, the third emission control line ELc and the driver power line VGHL may be arranged at (e.g., in or on) the same layer as each other, and may be provided as one body. Hereinafter, for convenience of description, a case where the third emission control line ELc and the driver power line VGHL are arranged at (e.g., in or on) the same layer as each other and provided as one body may be mainly described in more detail.

The driver power line VGHL may be arranged at (e.g., in or on) a layer that is different from that of the driving voltage line PL in a cross-sectional view of the display apparatus. As an example, the driver power line VGHL may be arranged on one of the buffer layer 111, the first gate insulating layer 112, the second gate insulating layer 113, the first planarization layer 117, or the second planarization layer 118 shown in FIGS. 12B and 13B. In an embodiment, the driver power line VGHL may be arranged at (e.g., in or on) the same layer as that of the driving voltage line PL in a cross-sectional view of the display apparatus. Hereinafter, for convenience of description, a case where the driver power line VGHL and the driving voltage line PL are arranged at (e.g., in or on) different layers from each other may be mainly described in more detail. In this case, the driver power line VGHL may be arranged at (e.g., in or on) the same layer as that of the third emission control line ELc described above.

The driver power line VGHL may not be connected to the driving voltage line PL, and may be connected to the operation control thin-film transistor T5. In this case, an emission control voltage VGH is applied through the driver power line VGHL, and because the emission control voltage VGH may have a high voltage, the operation control thin-film transistor T5 may be turned off.

Therefore, a separate signal may not be generated by the auxiliary pixel circuits PC', and thus, an external pixel circuit may not malfunction through the data line DL.

In addition, in this case, the driver power line VGHL may have the same or substantially the same shape as that of the third emission control line ELc as shown in FIG. 10 or FIG. 12A. In this case, when the driver power line VGHL is arranged at (e.g., in or on) the same layer as that of the third emission control line ELc, the driver power line VGHL may be connected to the driving voltage line PL through a contact hole. On the other hand, in the case where the driver power line VGHL is arranged at (e.g., in or on) the same layer as that of the driving voltage line PL, the driver power line VGHL and the driving voltage line PL may partially overlap with each other, or a contact hole may be formed in a direction parallel to or substantially parallel to one surface of the substrate to connect the driver power line VGHL and the driving voltage line PL that are spaced apart from each other to each other.

As described above, the operation control thin-film transistor T5 may not only receive the emission control voltage VGH through the driver power line VGHL, but may also receive the driving voltage EVLDD, and thus, may always maintain or substantially maintain an off-state.

Accordingly, in the display apparatus 1, a separate signal may not be generated by the auxiliary pixel circuits PC', and thus, an external pixel circuit may not malfunction through the data line DL.

Figure 19:
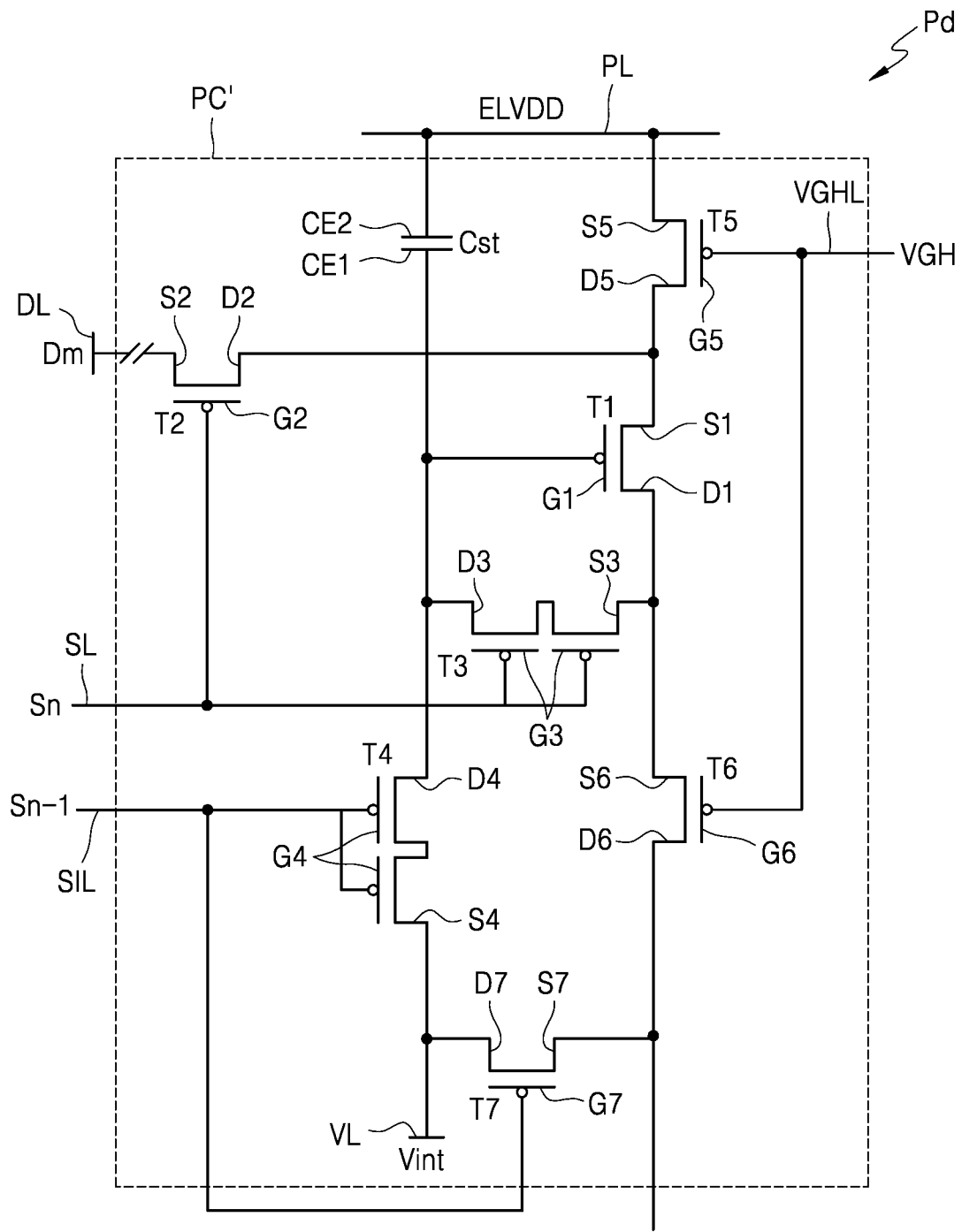
FIG. 19 is an equivalent circuit diagram of an auxiliary pixel circuit according to another embodiment.

FIG. 19 is an equivalent circuit diagram of an auxiliary pixel circuit according to another embodiment.

Referring to FIG. 19, the auxiliary pixel circuit PC' may be the same or substantially the same as (or similar to) that shown in FIG. 18, but the data line DL in the auxiliary pixel circuit PC' of FIG. 19 may be electrically insulated from the switching thin-film transistor T2. In this case, because a method in which the switching thin-film transistor T2 is insulated from the data line DL is the same or substantially the same as (or similar to) that described with reference to FIG. 17, redundant description thereof may not be repeated.

The driver power line VGHL may be connected to the third emission control line ELc of the auxiliary pixel circuits PC'. In this case, because a method in which the third emission control line ELc is connected to the driver power line VGHL is the same or substantially the same as (or similar to) that described with reference to FIG. 18, redundant description thereof may not be repeated.

Accordingly, in the display apparatus 1, a separate signal is not generated by the auxiliary pixel circuits PC', and thus, an external pixel circuit may not malfunction through the data line DL.

One or more embodiments of the present disclosure may prevent or substantially prevent a pixel circuit from malfunctioning due to a malfunction of an auxiliary pixel circuit.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display apparatus comprising:
a substrate comprising:
a first region;
a second region;
a first non-display area surrounding the first region and the second region; and
a display area surrounding at least a portion of an outline of the first non-display area, at least a portion of which is inside the display area;
a plurality of dummy pixels at the first non-display area, and configured to not emit light;
a plurality of emission control lines connected to at least one of the plurality of dummy pixels; and
a plurality of power supply lines configured to supply a driving voltage to the plurality of dummy pixels, respectively,
wherein one of the plurality of power supply lines overlaps with one of the plurality of emission control lines in a thickness direction perpendicular to a display surface of the display area and is directly and electrically connected to the one of the plurality of emission control lines through a contact hole to supply the driving voltage to the one of the plurality of emission control lines, and the one of the plurality of power supply lines is connected to one of the plurality of dummy pixels.

2. The display apparatus of claim 1, wherein at least one of the plurality of dummy pixels is between the first region and the second region.

3. The display apparatus of claim 1, wherein the plurality of emission control lines and the plurality of power supply lines are at different layers from each other, and connected to each other through contact holes.

4. The display apparatus of claim 1, wherein the plurality of emission control lines comprise a protrusion overlapping with the plurality of power supply lines in a plan view, the protrusion being connected to the plurality of power supply lines.

5. The display apparatus of claim 4, wherein the plurality of power supply lines are connected to the protrusion through a contact hole.

6. The display apparatus of claim 1, wherein the plurality of dummy pixels comprise a switching thin-film transistor, and wherein at least a portion of the switching thin-film transistor is disconnected.

7. The display apparatus of claim 1, further comprising a plurality of data lines configured to transfer a data signal to the plurality of dummy pixels,
- wherein each of the plurality of dummy pixels comprises a switching thin-film transistor, and
- wherein the data lines are electrically insulated from the switching thin-film transistor.

8. The display apparatus of claim 1, further comprising a plurality of pixels comprising:
- a pixel circuit comprising at least one transistor; and
- a display element connected to the pixel circuit,
- wherein each of the plurality of dummy pixels comprises an auxiliary pixel circuit comprising at least one dummy transistor.

9. The display apparatus of claim 8, further comprising a pixel- defining layer on the pixel circuit, the pixel-defining layer having an opening corresponding to each of the plurality of pixels,
- wherein the pixel-defining layer comprises a flat top surface corresponding to the plurality of dummy pixels.

10. The display apparatus of claim 1, further comprising an electronic element corresponding to at least one of the first region or the second region.

11. The display apparatus of claim 1, wherein a size of the first region is different from a size of the second region.

12. The display apparatus of claim 1, further comprising first and second driver circuits at a second non-display area surrounding at least a portion of the display area,
- wherein the first and second driver circuits face each other.

13. The display apparatus of claim 12, wherein the substrate comprises long sides and short sides, and the first driver circuit and the second driver circuit are located in a direction along the long sides of the substrate.

* * * * *